United States Patent
Kubo et al.

(10) Patent No.: US 10,623,005 B2
(45) Date of Patent: Apr. 14, 2020

(54) PLL CIRCUIT AND CDR APPARATUS

(71) Applicant: THINE ELECTRONICS, INC., Tokyo (JP)

(72) Inventors: Shunichi Kubo, Tokyo (JP); Mitsutoshi Sugawara, Tokyo (JP); Satoshi Miura, Sujinami-ku (JP); Akihiro Moto, Tokyo (JP)

(73) Assignee: THINE ELECTRONICS, INC., Tokyo (JP)

( * ) Notice: Subject to any disclaimer, the term of this patent is extended or adjusted under 35 U.S.C. 154(b) by 0 days.

(21) Appl. No.: 16/291,604

(22) Filed: Mar. 4, 2019

(65) Prior Publication Data

US 2019/0273501 A1 Sep. 5, 2019

(30) Foreign Application Priority Data

Mar. 5, 2018 (JP) .................. 2018-038726

(51) Int. Cl.
| | | |
|---|---|---|
| *H04L 7/033* | (2006.01) | |
| *H03L 7/08* | (2006.01) | |
| *H03L 7/093* | (2006.01) | |
| *H02M 3/07* | (2006.01) | |
| *H04L 7/00* | (2006.01) | |
| *H03H 7/06* | (2006.01) | |

(52) U.S. Cl.
CPC ............ *H03L 7/0807* (2013.01); *H02M 3/07* (2013.01); *H03H 7/06* (2013.01); *H03L 7/0802* (2013.01); *H03L 7/093* (2013.01); *H04L 7/0087* (2013.01); *H04L 7/0331* (2013.01)

(58) Field of Classification Search
CPC ... H04L 7/0807; H04L 7/0331; H04L 7/0802; H04L 7/0337; H04L 7/0334; H04L 7/033; H04L 7/0029; H04L 7/0087; H02M 3/07; H03L 7/093; H03L 7/091; H03L 7/0807; H03L 7/0802; H03H 7/06
See application file for complete search history.

(56) References Cited

U.S. PATENT DOCUMENTS

| | | | | |
|---|---|---|---|---|
| 5,831,483 A | * | 11/1998 | Fukuda ................ | H03L 7/0898 331/17 |
| 2005/0030001 A1 | * | 2/2005 | Jasa ...................... | H03L 7/087 324/76.53 |
| 2006/0097795 A1 | * | 5/2006 | Sohn ..................... | H03L 7/0812 331/16 |
| 2010/0067636 A1 | * | 3/2010 | Bae ...................... | H03L 7/0891 375/376 |

FOREIGN PATENT DOCUMENTS

JP 4089030 B2 5/2008

* cited by examiner

*Primary Examiner* — Ted M Wang
(74) *Attorney, Agent, or Firm* — Sughrue Mion, PLLC

(57) ABSTRACT

A PLL circuit includes a phase comparator, a charge pump 20, a loop filter 30, a voltage controlled oscillator 40, a frequency divider, and a phase compensator 70. The loop filter 30 includes a resistor 31, a first capacitance element 32, and a second capacitance element 33. The phase compensator 70 is provided in parallel to the charge pump 20 and adds a differentiation term to an open-loop transfer function. The phase compensator 70 includes a buffer 71 receiving a phase difference signal output from the phase comparator and a third capacitance element 72 provided between an output terminal of the buffer 71 and an input terminal of the loop filter 30.

15 Claims, 28 Drawing Sheets

*Fig.25*

|  | FIRST PERIOD | SECOND PERIOD |
|---|---|---|
| $C_1$ | 10 pF | 10 pF |
| $g_m$ | 50 μA | 10 μA |
| $K_{VCO}$ | 2 GHz/V | 2 GHz/V |
| R | 20 kΩ | 1 kΩ |
| $C_2$ | 5 pF | 5 pF |
| N | 200 | 1 |
| $C_s$ | 1 pF | 0.5 pF |
| BANDWIDTH | 1 MHz | 10 MHz |

PLL CIRCUIT AND CDR APPARATUS

TECHNICAL FIELD

The present invention relates to a PLL circuit and a CDR apparatus.

BACKGROUND

Generally, a phase locked loop (PLL) circuit includes a phase comparator, a charge pump, a loop filter, and a voltage controlled oscillator (VCO), which configure a loop (see Patent Document 1). The PLL circuit is used as a frequency synthesizer outputting an oscillation signal having a frequency obtained by multiplying a frequency of an input oscillation signal by a constant. In addition, the PLL circuit can recover a clock embedded in an input digital signal in a clock data recovery (CDR) apparatus.

The PLL circuit operates as follows. If a control voltage value is input to the voltage controlled oscillator, an oscillation signal having a frequency corresponding to a control voltage value thereof is output from the voltage controlled oscillator. The oscillation signal output from the voltage controlled oscillator or a signal obtained by dividing the oscillation signal is input to the phase comparator as a feedback oscillation signal. In addition to this feedback oscillation signal, another input signal (the oscillation signal or a digital signal) is also input to the phase comparator. In the phase comparator, a phase difference between the input signal and the feedback oscillation signal is detected, and a phase difference signal representing the detected phase difference is output to the charge pump.

The charge pump receiving the phase difference signal outputs a charging and discharging current according to the phase difference represented by the phase difference signal. The charging and discharging current is input to the loop filter. The loop filter includes a resistor and a first capacitance element connected in series with each other, and also includes a second capacitance element provided in parallel to the resistor and the first capacitance element. The loop filter outputs a control voltage value increased or decreased according to the amount of charging and discharging to the voltage controlled oscillator. The control voltage value output from the loop filter is input to the voltage controlled oscillator, and the oscillation signal having a frequency corresponding to the control voltage value is output from the voltage controlled oscillator.

In the PLL circuit including the loop, the control voltage value output from the loop filter and input to the voltage controlled oscillator converges to a certain value such that the phase difference detected by the phase comparator is reduced. The oscillation signal having a frequency obtained by multiplying the frequency of the input oscillation signal by a constant is output from the voltage controlled oscillator, or the clock embedded in the input digital signal is recovered and output.

Patent Document 1: Japanese Patent No. 4089030

SUMMARY

In the PLL circuit, if there is a parasitic capacitance due to a wire between a loop filter and a voltage controlled oscillator or due to a configuration of the voltage controlled oscillator, the parasitic capacitance thereof is added to a second capacitance element of the loop filter. As a result, an operation of the PLL circuit may become unstable, and a clock and data recovery operation of a CDR apparatus including the PLL circuit may also become unstable.

The present invention is to solve the above-described problems, and an object of the present invention is to provide a PLL circuit and a CDR apparatus capable of suppressing operation instability caused by a parasitic capacitance.

A PLL circuit according to the present invention includes (1) a voltage controlled oscillator receiving a control voltage value and outputting an oscillation signal having a frequency corresponding to the control voltage value, (2) a phase comparator receiving the oscillation signal output from the voltage controlled oscillator or a signal obtained by dividing a frequency of the oscillation signal as a feedback oscillation signal and also receiving an input signal, detecting a phase difference between the feedback oscillation signal and the input signal, and outputting a phase difference signal representing the phase difference, (3) a charge pump receiving the phase difference signal output from the phase comparator and outputting a charging and discharging current according to the phase difference represented by the phase difference signal, (4) a loop filter receiving the charging and discharging current output from the charge pump and outputting the control voltage value increased or decreased according to an amount of charging and discharging to the voltage controlled oscillator, and (5) a phase compensation unit (phase compensator) provided in parallel with the charge pump and adding a differentiation term to an open-loop transfer function.

In the PLL circuit according to the present invention, it is preferable that the loop filter includes a resistor receiving the charging and discharging current output from the charge pump at a first terminal, a first capacitance element connected to a second terminal of the resistor, and a second capacitance element connected to the first terminal of the resistor, and the phase compensator includes a buffer receiving the phase difference signal output from the phase comparator and a third capacitance element provided between an output terminal of the buffer and the first terminal of the resistor.

In the PLL circuit according to the present invention, it is preferable that a relationship of $AC_S/g_m=(C_2+AC_S)R$ is established between a conductance $g_m$ of the charge pump, a resistance value R of the resistor, a capacitance value $C_2$ of the second capacitance element, a capacitance value $C_S$ of the third capacitance element, and a gain A of the buffer. In addition, it is preferable that the second capacitance element and the third capacitance element have the same configuration.

In the PLL circuit according to the present invention, it is preferable that the phase compensator includes M sets, each including the buffer and the third capacitance element, connected in parallel with each other. It is preferable that the phase compensator includes a switch provided between the buffer and the third capacitance element or between the third capacitance element and the loop filter in any one of the M sets or a plurality of sets. In addition, it is preferable that the phase compensator includes a first switch provided between the buffer and the third capacitance element or between the third capacitance element and the loop filter and a second switch provided between a connection point of the third capacitance element and the first switch and a bias potential terminal, in any one of the M sets or a plurality of sets.

In the PLL circuit according to the present invention, it is preferable that the buffer includes a MOS transistor and a load, a gate of the MOS transistor receives the phase difference signal, a drain of the MOS transistor is connected to a first reference potential terminal, a source of the MOS transistor is connected to the third capacitance element, and the load is provided between the source of the MOS transistor and a second reference potential terminal.

In the PLL circuit according to the present invention, it is preferable that the buffer includes even-numbered inverter circuits connected in cascade. Any one or a plurality of inverter circuits of the even-numbered inverter circuits may include a PMOS transistor and an NMOS transistor, include an output terminal configured by connecting each drain of the PMOS transistor and the NMOS transistor with each other, and may output a logically inverted signal of a signal commonly input to gates of the PMOS transistor and the NMOS transistor from the output terminal. Alternatively, any one or a plurality of inverter circuits of the even-numbered inverter circuits may include a MOS transistor and a load, the load is provided between a drain of the MOS transistor and a first reference potential terminal, a source of the MOS transistor may be connected to a second reference potential terminal, and a logically inverted signal of a signal input to a gate of the MOS transistor may be output from the drain of the MOS transistor. Alternatively, any one or a plurality of inverter circuits of the even-numbered inverter circuits may include a MOS transistor, a load, and a current source, the load is provided between a drain of the MOS transistor and a first reference potential terminal, the current source may be provided between a source of the MOS transistor and a second reference potential terminal, and a logically inverted signal of a signal input to a gate of the MOS transistor may be output from the drain of the MOS transistor.

A CDR apparatus according to the present invention is a CDR apparatus receiving a digital signal in which a clock is embedded, recovering data and the clock based on the digital signal, and outputting the recovered data and the recovered clock, and includes (1) a sampler sampling the data of the digital signal at a timing instructed by the recovered clock and outputting the sampled data as the recovered data in synchronization with the recovered clock, and (2) the PLL circuit according to any one of aspects described above, which receives the recovered data to the phase comparator as the input signal, outputs the recovered clock as the oscillation signal from the voltage controlled oscillator, and provides the sampler with the recovered clock.

A CDR apparatus according to the present invention is a CDR apparatus receiving a digital signal in which a clock is embedded, recovering data and the clock based on the digital signal, and outputting the recovered data and the recovered clock, and includes (1) a sampler sampling the data of the digital signal at a timing instructed by the recovered clock and outputting the sampled data as the recovered data in synchronization with the recovered clock, (2) the PLL circuit according to any one of aspects described above, which includes a first phase comparator and a second phase comparator as the phase comparator, outputs the recovered clock as the oscillation signal from the voltage controlled oscillator, and provides the sampler with the recovered clock, (3) a frequency synchronization detection unit detecting whether or not frequencies are synchronized between the feedback oscillation signal and a reference clock input to the first phase comparator, and (4) a selection unit selecting a phase difference signal output from the first phase comparator receiving a reference oscillation signal as the input signal and outputting the selected phase difference signal to the charge pump during a first period in which a frequency synchronization is not detected by the frequency synchronization detection unit, and selecting the phase difference signal output from the second phase comparator receiving the recovered data as the input signal and outputting the selected phase difference signal to the charge pump during a second period in which the frequency synchronization is detected by the frequency synchronization detection unit. It is preferable that any of the charge pump, the loop filter, the voltage controlled oscillator, and the phase compensator has parameter values different from each other during the first period and the second period.

A PLL circuit and a CDR apparatus according to the present invention can suppress operation instability due to a parasitic capacitance.

BRIEF DESCRIPTION OF THE DRAWINGS

FIG. 25 is a table illustrating an example of each parameter value in each of a first period and a second period of the CDR apparatus 2A according to the present embodiment.

DESCRIPTION OF EMBODIMENTS

Figure 1:
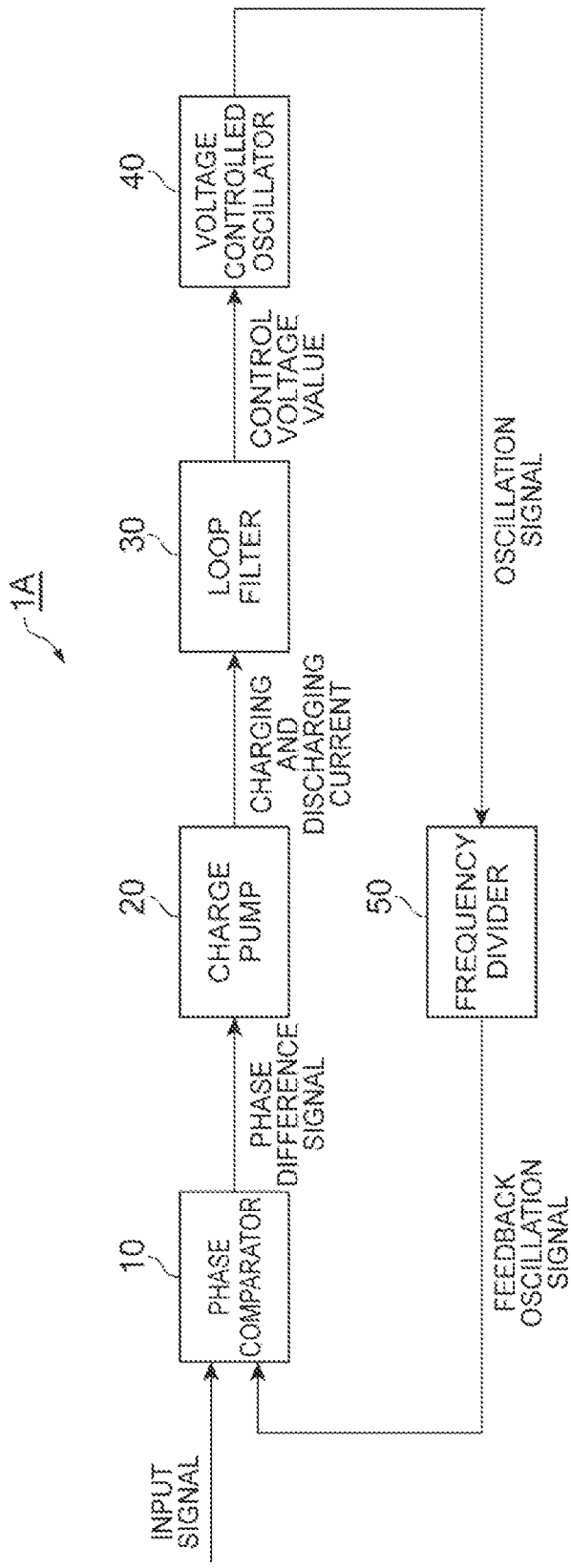
FIG. 1 is a diagram illustrating a configuration of a PLL circuit 1A according to a first comparative example.

Hereinafter, embodiments for implementing the present invention will be described in detail with reference to the accompanying drawings. In describing the drawings, the same elements are denoted by the same reference numerals, and duplicate description will be omitted. The present invention is not limited to the illustrative examples but is intended to be indicated by the scope of claims and include all modifications within the meaning and range equivalent to the scope of claims.

Figure 2:
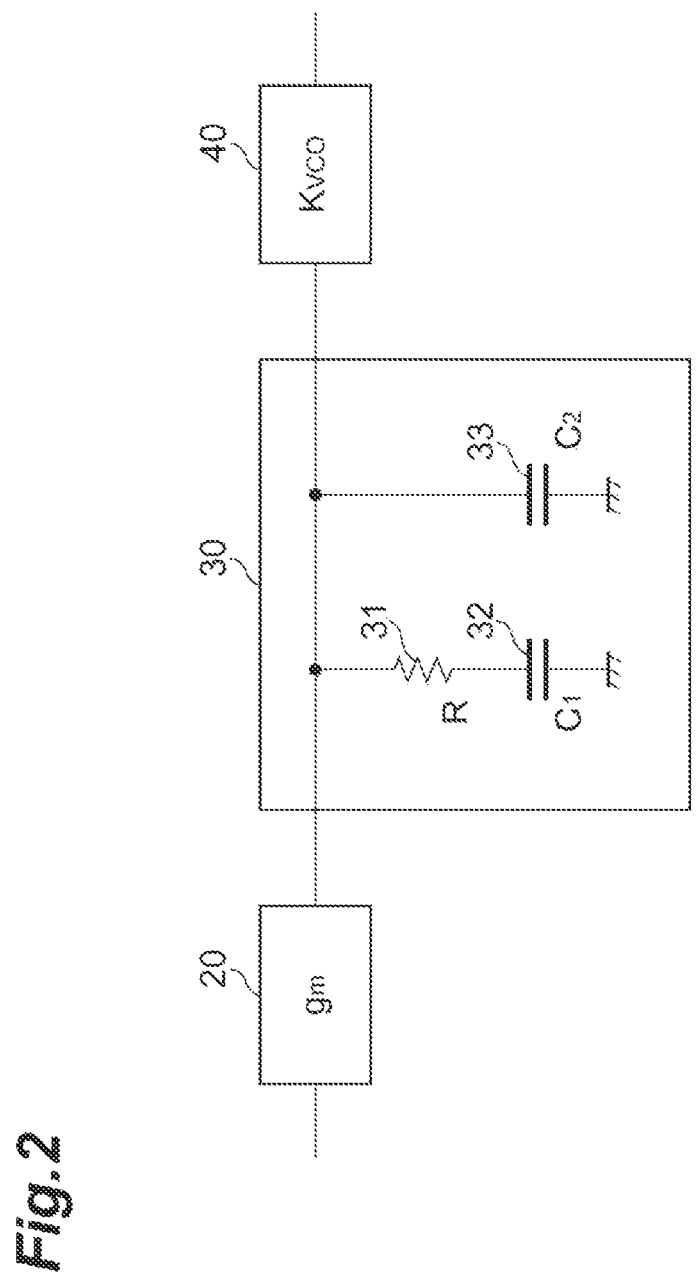
FIG. 2 is a diagram illustrating a configuration example of a loop filter 30 and the like of the PLL circuit 1A according to the first comparative example.

FIG. 1 is a diagram illustrating a configuration of a PLL circuit 1A of a first comparative example. The PLL circuit 1A includes a phase comparator 10, a charge pump 20, a loop filter 30, a voltage controlled oscillator 40, and a frequency divider 50. FIG. 2 is a diagram illustrating a configuration example of the loop filter 30 and the like. The loop filter 30 includes a resistor 31, a first capacitance element 32, and a second capacitance element 33.

The phase comparator 10 receives a feedback oscillation signal output from the frequency divider 50 and also receives an input signal. The input signal may be a reference oscillation signal whose frequency is constant or may be a digital signal whose period of each bit is constant. The phase comparator 10 detects a phase difference between the feedback oscillation signal and the input signal and outputs a phase difference signal representing the phase difference to the charge pump 20. The phase difference signal indicates which one of the feedback oscillation signal and the input signal leads in phase.

The charge pump 20 receives the phase difference signal output from the phase comparator 10 and outputs a charging and discharging current corresponding to the phase difference represented by the phase difference signal to the loop filter 30. The charging and discharging current output from the charge pump 20 to the loop filter 30 changes in polarity depending on which one of a reference oscillation signal and the input signal leads in phase. The loop filter 30 receives the charging and discharging current output from the charge pump 20, and outputs a control voltage value that is increased or decreased according to the amount of charging and discharging to the voltage controlled oscillator 40.

As illustrated in FIG. 2, the loop filter 30 includes a resistor 31 for receiving the charging and discharging current output from the charge pump 20 to a first terminal, a first capacitance element 32 provided between a second terminal of the resistor 31 and a ground potential terminal, and a second capacitance element 33 provided between the first terminal of the resistor 31 and the ground potential terminal.

An output terminal of the charge pump 20 and an input terminal of the voltage controlled oscillator 40 are connected to the first terminal of the resistor 31 of the loop filter 30.

The voltage controlled oscillator 40 receives a control voltage value output from the loop filter 30 and outputs an oscillation signal having a frequency corresponding to the control voltage value. The frequency divider 50 receives the oscillation signal output from the voltage controlled oscillator 40, divides the oscillation signal by N, generates a feedback oscillation signal, and outputs the feedback oscillation signal to the phase comparator 10.

The phase comparator 10, the charge pump 20, the loop filter 30, the voltage controlled oscillator 40, and the frequency divider 50 configure a loop. In this loop, a charging and discharging current is input from the charge pump 20 to the loop filter 30 such that a phase difference between the feedback oscillation signal and the input signal which are input to the phase comparator 10 is reduced. In a state where an operation of the loop is stabilized, the oscillation signal output from the voltage controlled oscillator 40 has a frequency obtained by multiplying the frequency of the input signal by N. The frequency divider 50 may not be provided, and in this case, the oscillation signal output from the voltage controlled oscillator 40 has the same frequency as a frequency of the reference oscillation signal, and it is assumed that a frequency division ratio N=1.

The input signal input to the phase comparator 10 is represented by CLKIN(t)=cos(ωt). ωt represents a phase. If $\Phi=\omega t$, the time differentiation of the phase $\Phi$ is a frequency ω of the input signal CLKIN(t), and the phase $\Phi$ is a time integral of the frequency ω. Therefore, it is possible to check a response to the phase and to confirm a stability of the PLL circuit. Frequency characteristics of the PLL circuit is represented by a phase domain model, and a transfer function H(s) of the PLL circuit is indicated by a ratio of an input $\phi$in and an output $\phi$out. Here, $s=j\omega_m$ and j is an imaginary number unit. $\omega_m$ is a modulation frequency of a phase, which is different from the frequency of the input signal CLKIN.

A conductance of the charge pump 20 is defined as $g_m$. A resistance value of the resistor 31 of the loop filter 30 is defined as R, a capacitance value of the first capacitance element 32 is defined as $C_1$, and a capacitance value of the second capacitance element 33 is defined as $C_2$. A characteristic of the voltage controlled oscillator 40 (dependency of the frequency of the oscillation signal with respect to the control voltage value) is defined as $K_{VCO}$.

Figure 3:
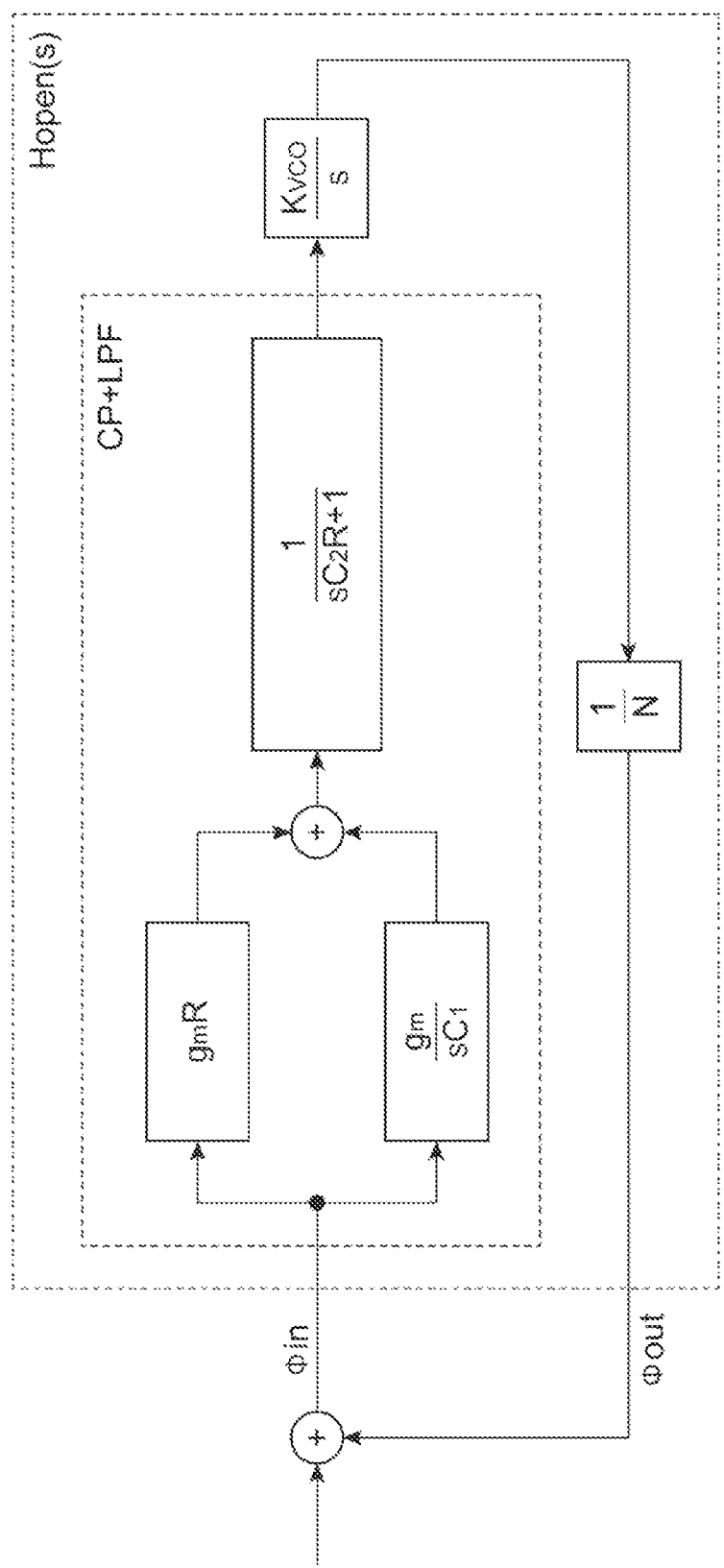
FIG. 3 is a diagram illustrating a phase region model of the PLL circuit 1A according to the first comparative example.

A transfer function $H_{lpf}(s)$ of the charge pump 20 and the loop filter 30 is represented by following Equation (1). An open-loop transfer function $H_{open}(s)$ of the PLL circuit 1A is represented by following Equation (2). ω1 is a modulation frequency of a zero point in the transfer function and is represented by following Equation (3). ω2 is a modulation frequency of a pole in the transfer function and is represented by following Equation (4). FIG. 3 is a diagram illustrating a phase domain model of the PLL circuit 1A according to the first comparative example.

Equation (1)

$$H_{lpf}(s) = \frac{1}{sC_2R+1}\left(g_mR + \frac{g_m}{sC_1}\right) = \frac{\frac{g_m}{C_2}(s+\omega_1)}{s(s+\omega_2)} \quad (1)$$

Equation (2)

$$H_{open}(s) = \frac{\phi_{out}}{\phi_{in}} = H_{lpf}(s) \cdot \frac{K_{VCO}}{s} \cdot \frac{1}{N} \quad (2)$$

$$= \frac{1}{sC_2R+1}\left(g_m R + \frac{g_m}{sC_1}\right)\frac{K_{VCO}}{s} \cdot \frac{1}{N}$$

$$= \frac{\frac{g_m}{C_2}(s+\omega_1)}{s(s+\omega_2)} \cdot \frac{K_{VCO}}{s} \cdot \frac{1}{N}$$

Equation (3)

$$\omega_1 = \frac{1}{C_1 R} \quad (3)$$

Equation (4)

$$\omega_2 = \frac{C_1 + C_2}{C_1 C_2 R} \quad (4)$$

Figure 4:
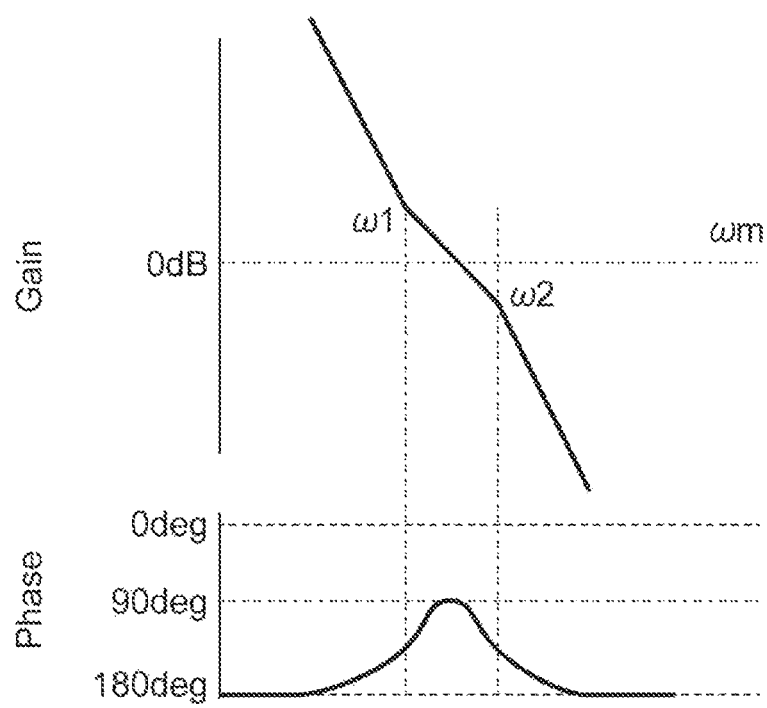
FIG. 4 is a diagram illustrating frequency characteristics (gain and phase) of the PLL circuit 1A according to the first comparative example.

FIG. 4 is a diagram illustrating frequency characteristics (gain and phase) of the PLL circuit 1A according to the first comparative example. If a phase is 180° at ωm where a gain becomes 0 dB, the PLL circuit is unstable. The closer the phase is 90° at ωm where the gain becomes 0 dB, the more stable the PLL circuit becomes. A phase margin is the extent to which the phase is away from 180° at ωm where the gain becomes 0 dB. For example, in a case where the phase is 90° at ωm where the gain becomes 0 dB, the phase margin is 90° (=180–90).

When designing the PLL circuit, it is preferable that ωm at which the gain becomes 0 dB is between ω1 and ω2. By satisfying such a condition, the phase margin becomes a value close to 90°, and the characteristics of the PLL circuit are stabilized. Empirically, it is preferable that ω2 is approximately 10 to 50 times ω1 (following Equation (5)). From this, it is preferable that a capacitance value $C_1$ of the first capacitance element 32 and a capacitance value $C_2$ of the second capacitance element 33 satisfy following Equation (6).

Equation (5)

$$\omega_2 > 10\omega_1 \quad (5)$$

Equation (6)

$$\frac{1}{10} > \frac{C_2}{C_1} \quad (6)$$

However, a parasitic capacitance may exist in a wire between the loop filter 30 and the voltage controlled oscillator 40, and a parasitic capacitance due to a configuration of the voltage controlled oscillator 40 may exist. The parasitic capacitance is added to the second capacitance element 33 of the loop filter 30. As a result, the apparent capacitance value $C_2$ of the second capacitance element 33 increases. If the apparent capacitance value $C_2$ increases, Equation (5) and Equation (6) described above are not satisfied, and the PLL circuit becomes unstable.

Figure 5:
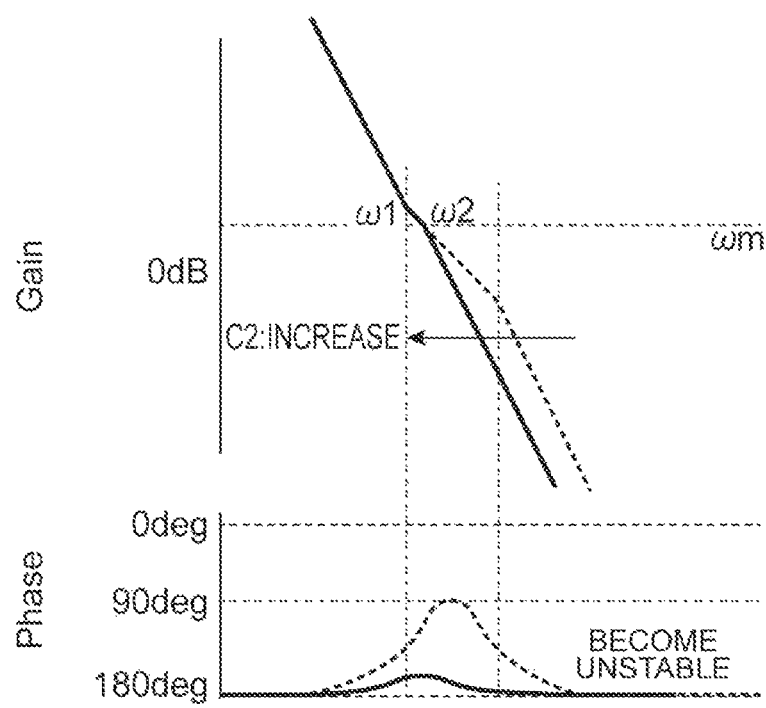
FIG. 5 is a diagram illustrating frequency characteristics (gain and phase) of the PLL circuit 1A according to the first comparative example when an apparent capacitance value $C_2$ is increased.

FIG. 5 is a diagram illustrating frequency characteristics (gain and phase) of the PLL circuit 1A according to the first comparative example when the apparent capacitance value $C_2$ increases. As illustrated in the figure, if the apparent capacitance value $C_2$ increases, ω1 does not change while ω2 decreases, and an interval between ω1 and ω2 is reduced.

Then, the phase approaches 180° at $\omega_m$ where a gain becomes 0 dB, and the phase margin is reduced. Since a range in which the gain can be set to 0 dB is narrowed, it is unstable depending on a variation in characteristics of an element. Therefore, the PLL circuit becomes unstable and cannot output an oscillation signal of an intended frequency. The unstable means that the PLL circuit illustrates oscillation, ringing or a sign of ringing at $\omega_m$ in a case where the gain is not 0 dB at $\omega_m$ where the phase is 180°.

In order to solve such a problem, it is considered to decrease ω1 as the apparent capacitance value $C_2$ of the second capacitance element 33 increases and ω2 decreases. In order to decrease ω1, it is necessary to increase $C_1 R$ as can be seen from Equation (3). In addition, it is necessary to increase $C_1$ of the first capacitance element 32 to satisfy Equation (6). However, in order not to affect stability of the open-loop transfer function $H_{open}(s)$, it is desirable to change another parameter value as $C_1$ is increased. From Equation (2) described above, two methods may be possible, which are a first method of setting $g_m$ to K times and setting R to 1/K as $C_1$ is set to K times and a second method of setting $K_{VCO}$ to K times and setting R to 1/K.

However, the methods have the following problems. In order to set $C_1$ to K times, it is necessary to set an area of the first capacitance element 32 to K times. In the first method of setting $g_m$ to K times, it is necessary to set the amount of a current output from the charge pump to K times, which increases power consumption. In the second method of setting $K_{VCO}$ to K times, the power consumption of the voltage controlled oscillator increases, and sensitivity of the voltage controlled oscillator with respect to random noise increases. There is a limitation in increasing $K_{VCO}$ of the voltage controlled oscillator. A general value of $K_{VCO}$ of LC-VCO is 1 to 2 GHz/V. A voltage controlled oscillator with high $K_{VCO}$ can be realized by a ring oscillator in which inverters are connected in multiple stages. However, as described above, a system having a large random noise and a high data rate (several tens of Gbps) is not realistic because influence of the random noise (several ps) is large. In general, LC-VCO with a small random noise is used for the system with a high data rate uses.

Accordingly, increment of $C_1$ of the first capacitance element 32 according to increment of the apparent capacitance value $C_2$ of the second capacitance element 33 is not desired because not only an area increases but also power consumption increases.

Japanese Patent No. 4089030 discloses an invention intended to solve such a problem. A PLL circuit of the invention disclosed in Japanese Patent No. 4089030 includes a configuration illustrated in FIG. 6.

Figure 6:
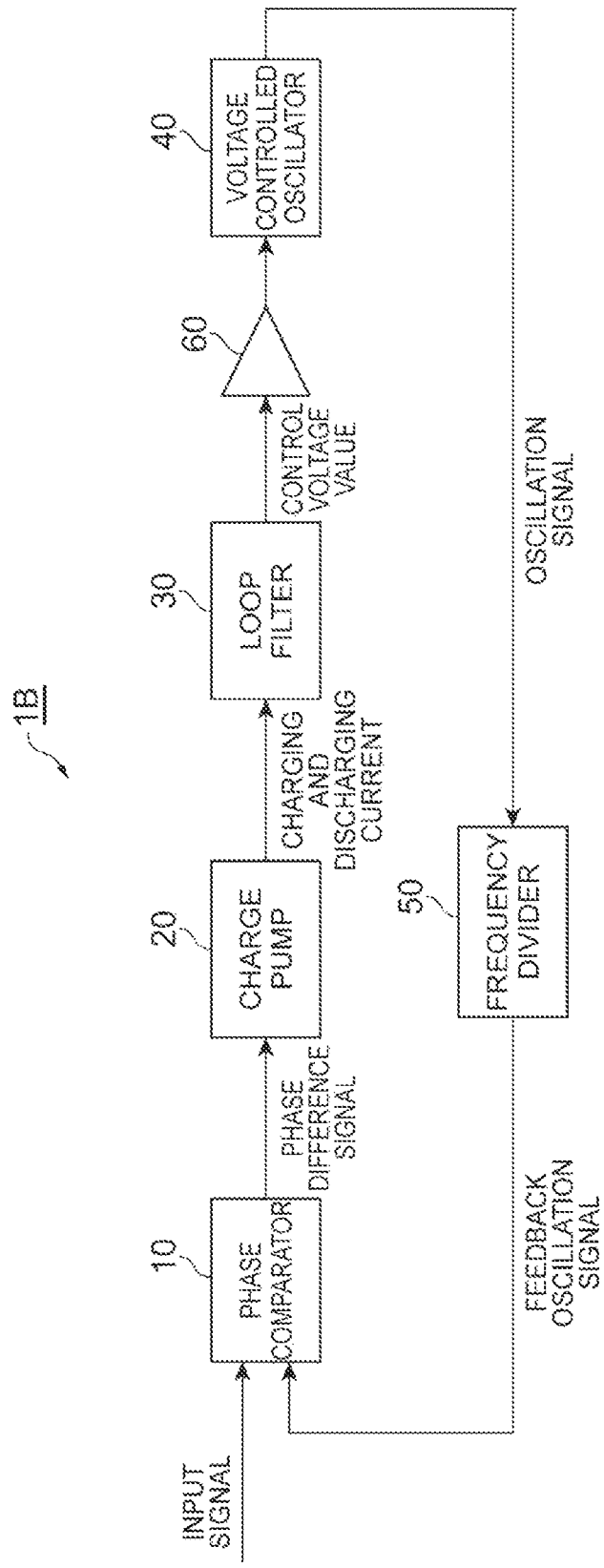
FIG. 6 is a diagram illustrating a configuration of a PLL circuit 1B according to a second comparative example.

FIG. 6 is a diagram illustrating a configuration of a PLL circuit 1B according to a second comparative example. Compared with the configuration of the PLL circuit 1A according to the first comparative example illustrated in FIG. 1, the PLL circuit 1B according to the second comparative example illustrated in FIG. 6 is different from the PLL circuit 1A according to the first comparative example in that the PLL circuit 1B further includes an amplifier 60.

The amplifier 60 is inserted between the loop filter 30 and the voltage controlled oscillator 40. By providing the amplifier 60, a parasitic capacitance caused by a configuration of the voltage controlled oscillator 40 can be separated from the second capacitance element 33 of the loop filter 30. Thereby, it is possible to suppress addition of the parasitic capacitance caused by the configuration of the voltage controlled oscillator 40 to the second capacitance element 33 of the loop filter 30 and to suppress an increase of the apparent capacitance value $C_2$ of the second capacitance element 33.

Figure 7:
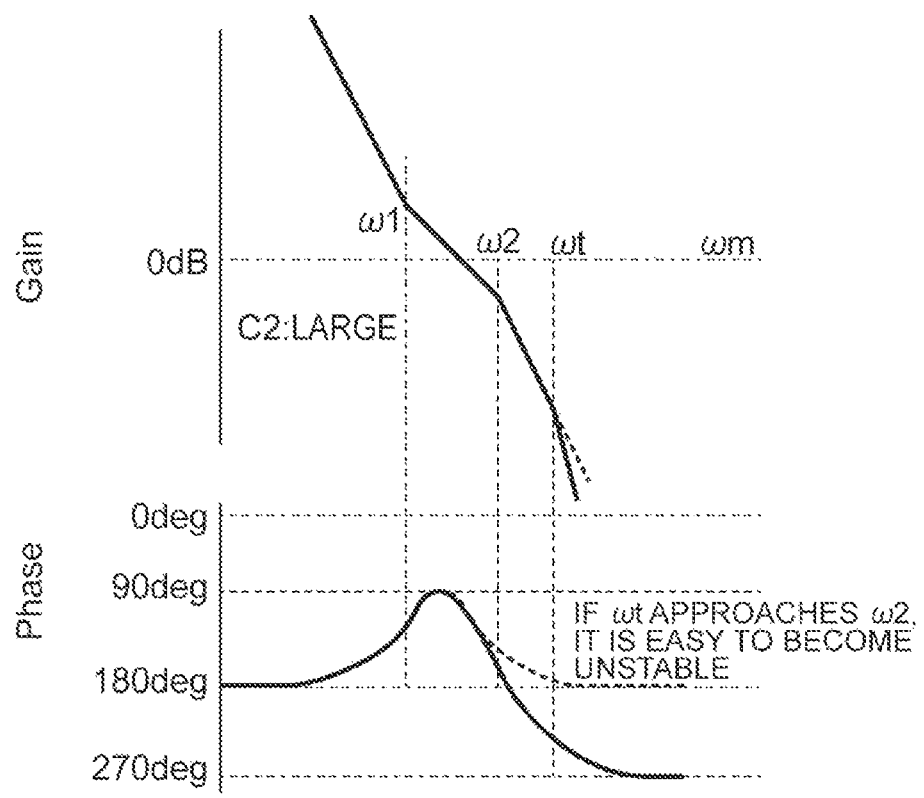
FIG. 7 is a diagram illustrating frequency characteristics (gain and phase) of the PLL circuit 1B according to the second comparative example.

The open-loop transfer function $H_{open}(s)$ of the PLL circuit 1B according to the second comparative example is represented by following Equation (7). $\omega t=1/\tau$. As illustrated in Equation (7), a factor $(1/(s\tau+1))$ representing frequency characteristics of the amplifier 60 is added to the open-loop transfer function $H_{open}(s)$. FIG. 7 is a diagram illustrating the frequency characteristics (gain and phase) of the PLL circuit 1B according to the second comparative example. In order to obtain a capacitance separation effect caused by the amplifier 60, it is necessary to set $\omega t > \omega 2$. Due to this, not only the area increases but also the power consumption increases, and thus, it is not desired, although the amplifier 60 is required for a high speed operation.

Equation (7)

$$H_{open}(s) = \frac{1}{s\tau+1} \cdot \frac{1}{sC_2R+1}\left(g_mR + \frac{g_m}{sC_1}\right)\frac{K_{VCO}}{s} \cdot \frac{1}{N} = \frac{1}{s/\omega_t+1} \cdot \frac{\frac{g_m}{C_2}(s+\omega_1)}{s(s+\omega_2)} \cdot \frac{K_{VCO}}{s} \cdot \frac{1}{N}$$ (7)

A PLL circuit 1C according to the embodiment to be described below can suppress operation instability due to a parasitic capacitance and can suppress an increase in area and an increase in power consumption.

Figure 8:
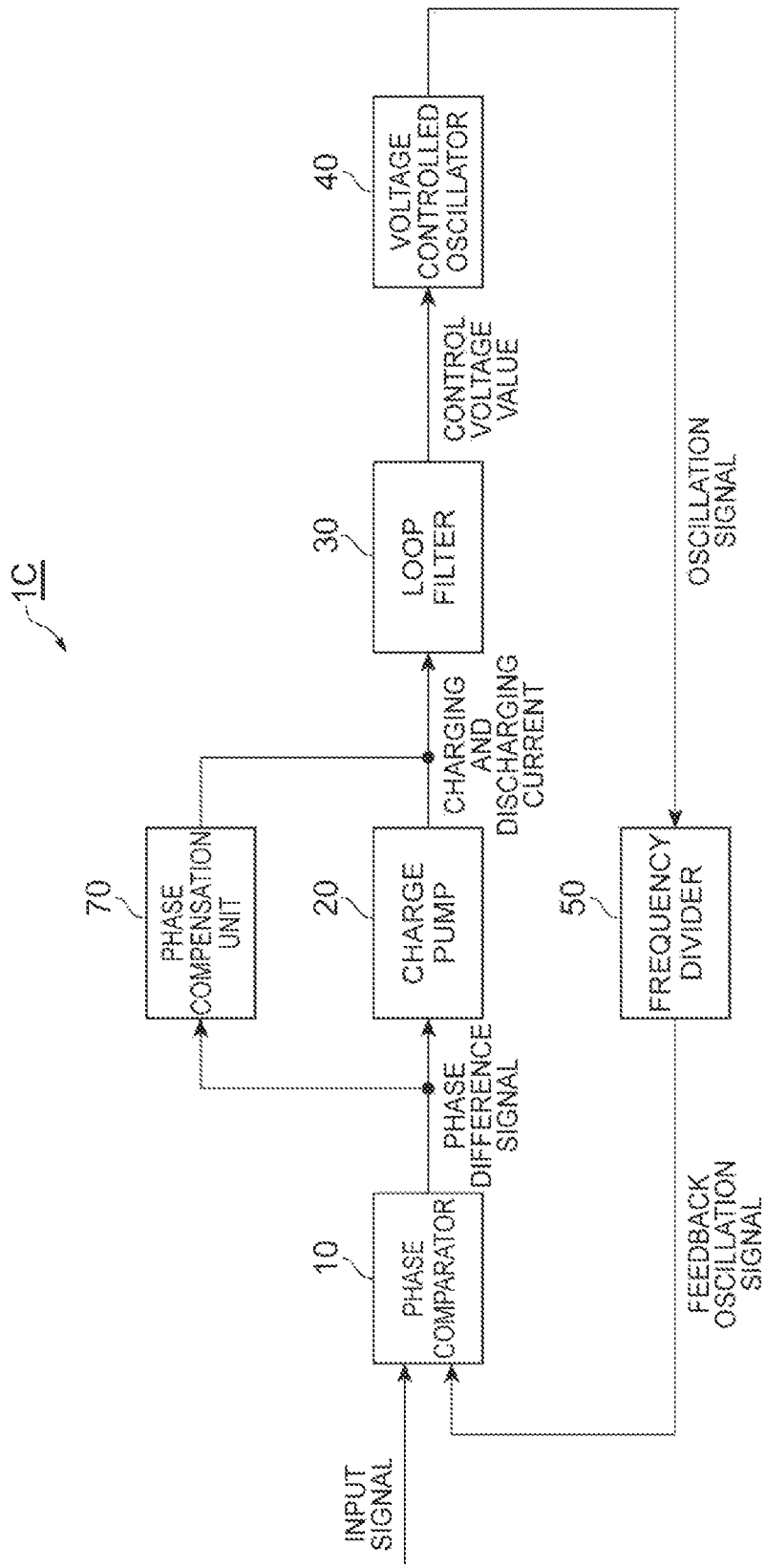
FIG. 8 is a diagram illustrating a configuration of a PLL circuit 1C according to the present embodiment.
Figure 9:
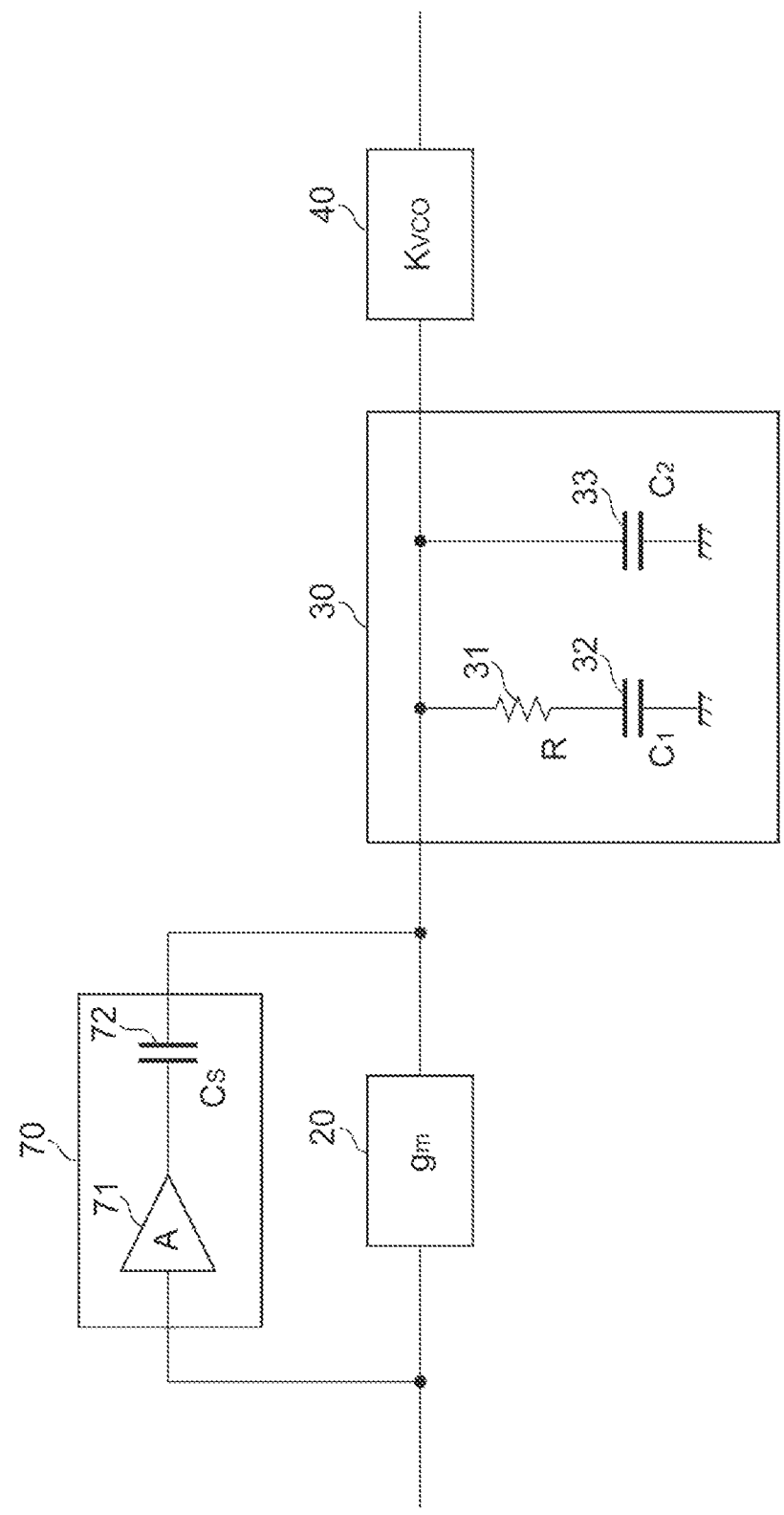
FIG. 9 is a diagram illustrating a configuration example of a loop filter 30, a phase compensation unit 70, and the like of the PLL circuit 1C according to the present embodiment.

FIG. 8 is a diagram illustrating a configuration of the PLL circuit 1C according to the present embodiment. The PLL circuit 1C includes the phase comparator 10, the charge pump 20, the loop filter 30, the voltage controlled oscillator 40, the frequency divider 50, and a phase compensation unit (phase compensator) 70. FIG. 9 is a diagram illustrating a configuration example of the loop filter 30, the phase compensation unit 70, and the like. Compared with the configuration of the PLL circuit 1A according to the first comparative example illustrated in FIG. 1, the PLL circuit 1C according to the present embodiment illustrated in FIG. 8 is different from the PLL circuit 1A according to the first comparative example in that the PLL circuit 1C further includes the phase compensation unit 70. The frequency divider 50 may not be provided, and in this case, the oscillation signal output from the voltage controlled oscillator 40 has the same frequency as a frequency of a reference oscillation signal, and the frequency division ratio N=1.

The phase compensation unit 70 is provided in parallel to the charge pump 20 and adds a differentiation term to an open-loop transfer function. The phase compensation unit 70 includes a buffer 71 which receives a phase difference signal output from the phase comparator 10 and a third capacitance element 72 provided between an output terminal of the buffer 71 and an input terminal (a first terminal of the resistor 31) of the loop filter 30. A gain A of the buffer 71 is a positive value. The gain A of the buffer 71 may be fixed or variable. A capacitance value $C_S$ of the third capacitance element 72 may also be fixed or variable.

It is preferable that the third capacitance element 72 and the second capacitance element 33 are elements having the same configuration. Thereby, temperature characteristics of the third capacitance element 72 and the second capacitance element 33 can be the same. For example, the third capacitance element 72 and the second capacitance element 33 may both have a Metal Insulator Metal (MIM) configuration or may have a configuration in which a source and a drain of a MOS transistor are electrically connected to each other in common.

Figure 10:
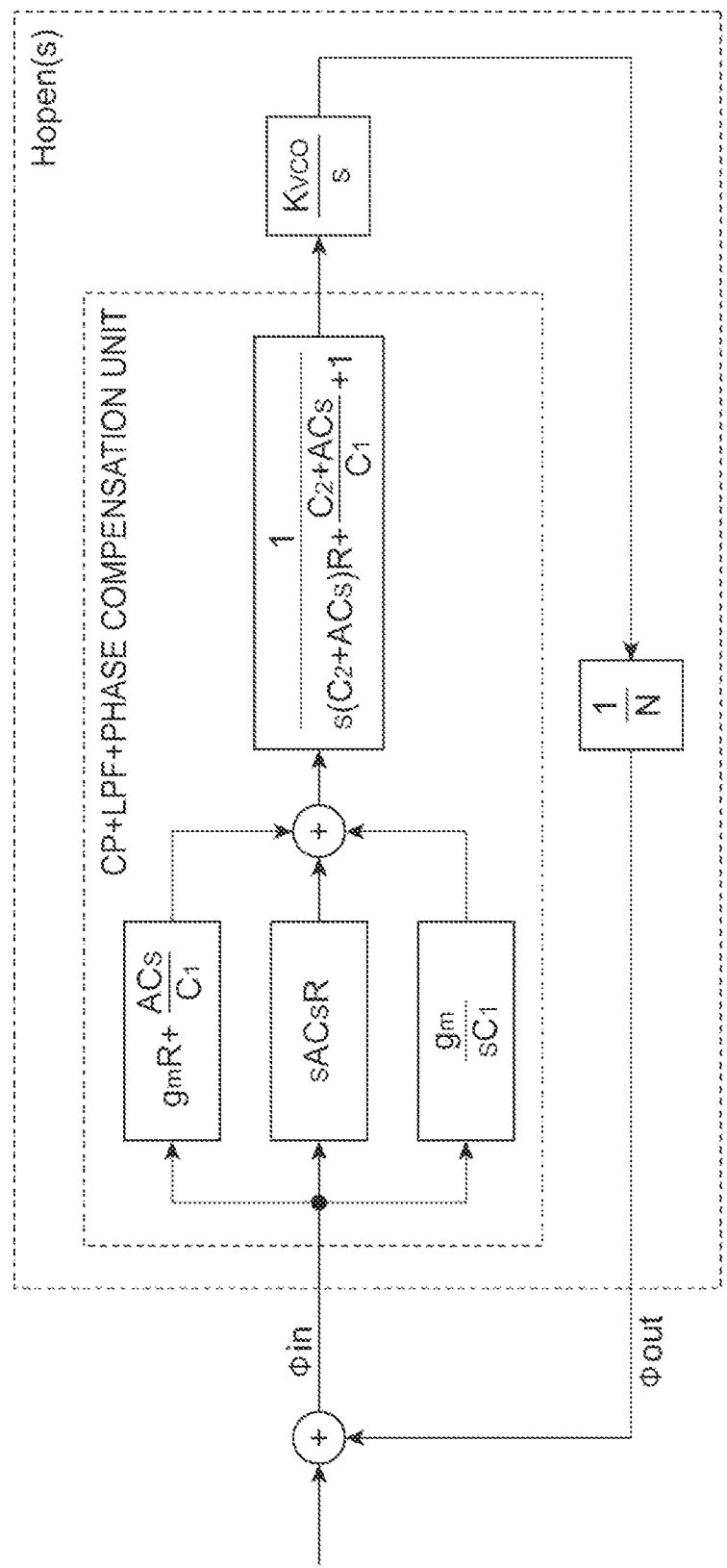
FIG. 10 is a diagram illustrating a phase region model of the PLL circuit 1C according to the present embodiment.

Transfer functions $H_{lpf}(s)$ of the charge pump 20, the loop filter 30, and the phase compensation unit 70 are represented by following Equation (8). The open-loop transfer function $H_{open}(s)$ of the PLL circuit 1C is represented by following Equation (9). FIG. 10 is a diagram illustrating a phase domain model of the PLL circuit 1C according to the present embodiment. In this way, the phase compensation unit 70 adds a differentiation term $(sAC_SR)$ to the open-loop transfer function $H_{open}(s)$ of the PLL circuit 1C.

Equation (8)

$$H_{lpf}(s) = \frac{1}{s(C_2+AC_S)R + \frac{C_2+AC_S}{C_1}+1}\left(g_mR + \frac{AC_S}{C_1} + \frac{g_m}{sC_1} + sAC_SR\right)$$ (8)

Equation (9)

$$H_{open}(s) = \frac{1}{s(C_2+AC_S)R + \frac{C_2+AC_S}{C_1}+1}\left(g_mR + \frac{AC_S}{C_1} + \frac{g_m}{sC_1} + sAC_SR\right)\frac{K_{VCO}}{s} \cdot \frac{1}{N}$$ (9)

If Equation (9) is modified, following Equation (10) is obtained. Compared with previous Equation (2), Equation (10) is different in terms of a first factor among four factors on the right side. $sAC_S/g_m+1$ in a numerator of the first factor indicates that a zero point is added to the transfer function.

Equation (10)

$$H_{open}(s) = \frac{\frac{sAC_S}{g_m}+1}{s(C_2+AC_S)R + \frac{C_2+AC_S}{C_1}+1}\left(g_mR + \frac{g_m}{sC_1}\right)\frac{K_{VCO}}{s} \cdot \frac{1}{N}$$ (10)

In general, $C_1$ is sufficiently larger than $C_2$ (Equation (6) described above). In addition, C1 may be sufficiently larger than $AC_S$. For example, $C_1$ is several tens of pF, $C_2$ is several pF, and $C_S$ is several hundred fF. Therefore, $C_1$ may be sufficiently larger than $C_2+AC_S$. In this case, Equation (10) becomes following Equation (11).

Equation (11)

$$H_{open}(s) = \frac{\frac{sAC_S}{g_m}+1}{s(C_2+AC_S)R+1}\left(g_mR + \frac{g_m}{sC_1}\right)\frac{K_{VCO}}{s} \cdot \frac{1}{N}$$ (11)

Furthermore, by setting each parameter value to satisfy a relationship of following Equation (12), the first factor on the right side of Equation (11) can be set to a value 1. In this case, Equation (11) becomes following Equation (13). If the third capacitance element 72 and the second capacitance element 33 are elements having the same configuration and temperature characteristics of the third capacitance element 72 and the second capacitance element 33 are the same, the relationship of Equation (11) is satisfied even in variation of temperature.

Equation (12)

$$\frac{AC_S}{g_m} = (C_2 + AC_S)R \quad (12)$$

Equation (13)

$$H_{open}(s) = \left(g_m R + \frac{g_m}{sC_1}\right)\frac{K_{VCO}}{s} \cdot \frac{1}{N} \quad (13)$$

As described above, by providing the phase compensation unit 70 in parallel to the charge pump 20, the influence of the parasitic capacitance on the apparent capacitance value $C_2$ can be suppressed, and the operation instability due to the parasitic capacitance can be suppressed.

Figure 11:
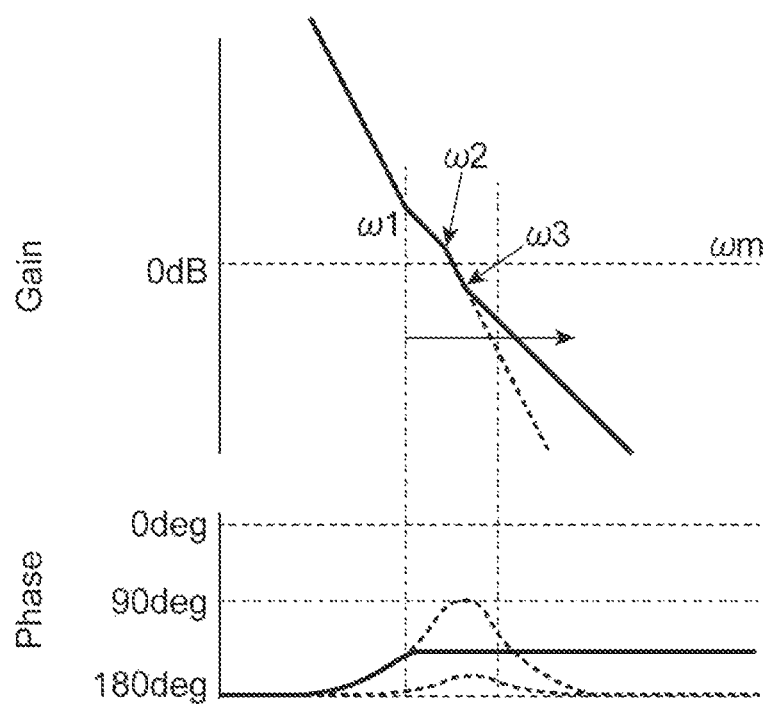
FIG. 11 is a diagram illustrating frequency characteristics (gain and phase) of the PLL circuit 1C according to the present embodiment.

However, in a case where a relationship of Equation (12) described above is not satisfied, the phase margin is somewhat damaged. In this case, Equation (11) described above is represented by following Equation (14). ω1 in Equation (14) is represented by following Equation (15), ω2 is represented by following Equation (16), and ω3 is represented by following Equation (17). FIG. 11 is a diagram illustrating frequency characteristics (gain and phase) of the PLL circuit 1C according to the present embodiment. In this case, it is necessary to set each parameter value such that ω1<ω3.

Equation (14)

$$H_{open}(s) = \frac{g_m^2}{C_S(C_2+C_S)} \cdot \frac{(s+\omega_3)(s+\omega_1)}{s(s+\omega_2)} \cdot \frac{K_{VCO}}{s} \cdot \frac{1}{N} \quad (14)$$

Equation (15)

$$\omega_1 = \frac{1}{C_1 R} \quad (15)$$

Equation (16)

$$\omega_2 = \frac{1}{(C_2+AC_S)R} + \frac{1}{C_1 R} \quad (16)$$

Equation (17)

$$\omega_3 = \frac{AC_S}{g_m} \quad (17)$$

Since the PLL circuit 1B according to the second comparative example is configured to include the amplifier 60, an increase in area and power consumption of the amplifier 60 become a problem. In contrast to this, the PLL circuit 1C according to the present embodiment is configured to include the phase compensation unit 70 including the buffer 71 and the third capacitance element 72. A capacitance value $C_S$ of the third capacitance element 72 is several hundred fF and an area of the phase compensation unit 70 can be reduced to approximately one tenth of the area of the amplifier 60. Since a DC current does not flow in the phase compensation unit 70 (or even if the DC current flows, the DC current is small), the power consumption of the phase compensation unit 70 can be reduced to approximately one tenth of the power consumption of the amplifier 60.

Next, a configuration example of the phase compensation unit 70 of the PLL circuit 1C according to the present embodiment will be further described. As illustrated in FIG. 9, a first configuration example may be provided in which the phase compensation unit 70 includes only one set of the buffer 71 and the third capacitance element 72, but as illustrated in FIGS. 12 to 15, another configuration example may be provided in which M sets are connected in parallel to each other, each including the buffer 71 and the third capacitance element 72. M is an integer of 2 or greater.

Figure 12:
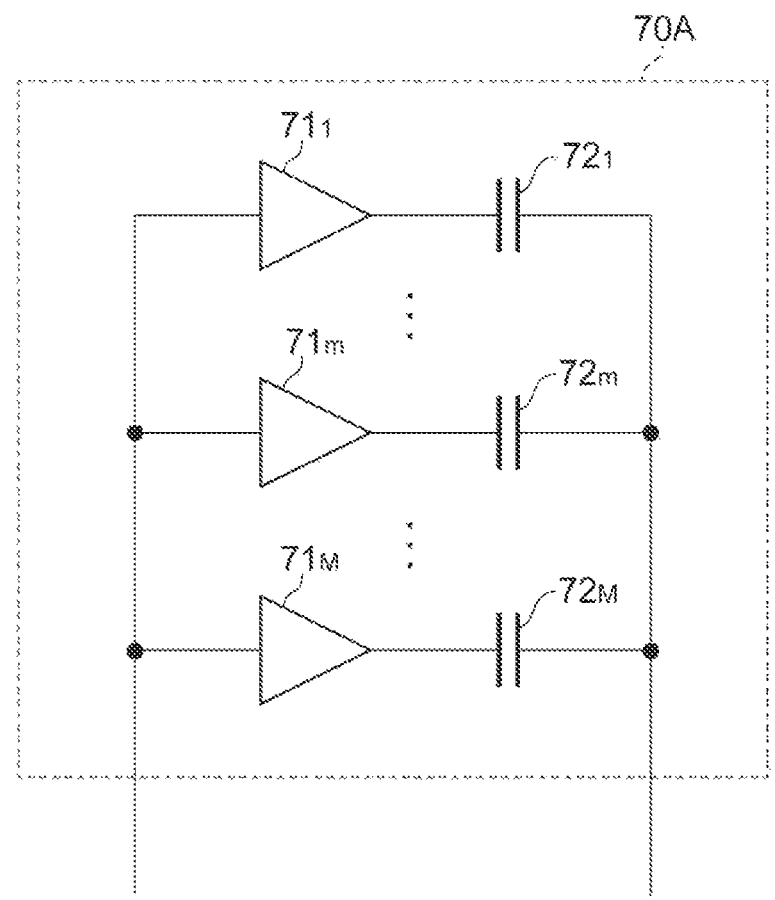
FIG. 12 is a diagram illustrating a configuration of a second configuration example of the phase compensation unit 70.

FIG. 12 is a diagram illustrating a configuration according to a second configuration example of the phase compensation unit 70. A phase compensation unit 70A according to the second configuration example illustrated in this figure includes buffers $71_1$ to $71_M$ and capacitance elements $72_1$ to $72_M$. A set including the buffer $71_m$ of the buffers $71_1$ to $71_M$ and the capacitance element $72_m$ of the capacitance elements $72_1$ to $72_M$ is referred to as an m-th set, and the first to M-th sets are connected in parallel to each other.

Figure 13:
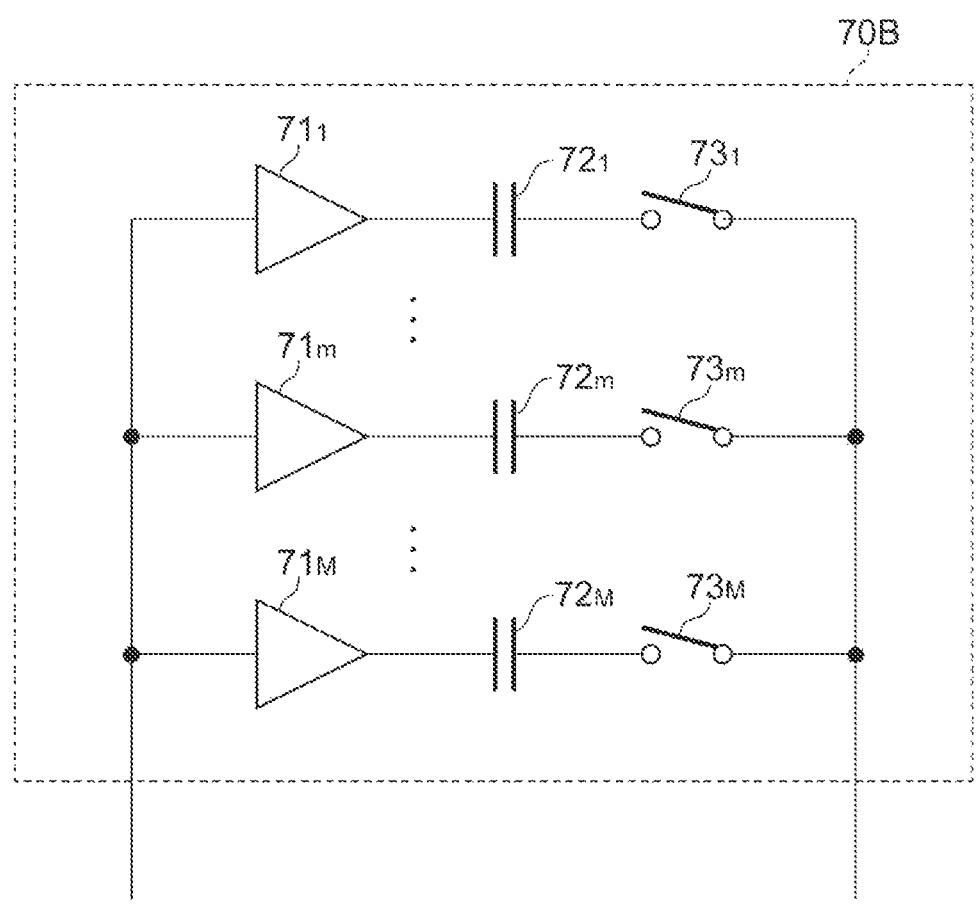
FIG. 13 is a diagram illustrating a configuration of a third configuration example of the phase compensation unit 70.

FIG. 13 is a diagram illustrating a configuration according to a third configuration example of the phase compensation unit 70. A phase compensation unit 70B according to the third configuration example illustrated in this figure includes the buffers $71_1$ to $71_M$, the capacitance elements $72_1$ to $72_M$, and switches $73_1$ to $73_M$. A set including the buffer $71_m$, the capacitance element $72_m$, and the switch $73_m$ is referred to as an m-th set, and the first to M-th sets are connected in parallel to each other. In the phase compensation unit 70B according to the third configuration example, the switch $73_m$ is provided at a subsequent stage of the capacitance element $72_m$.

Figure 14:
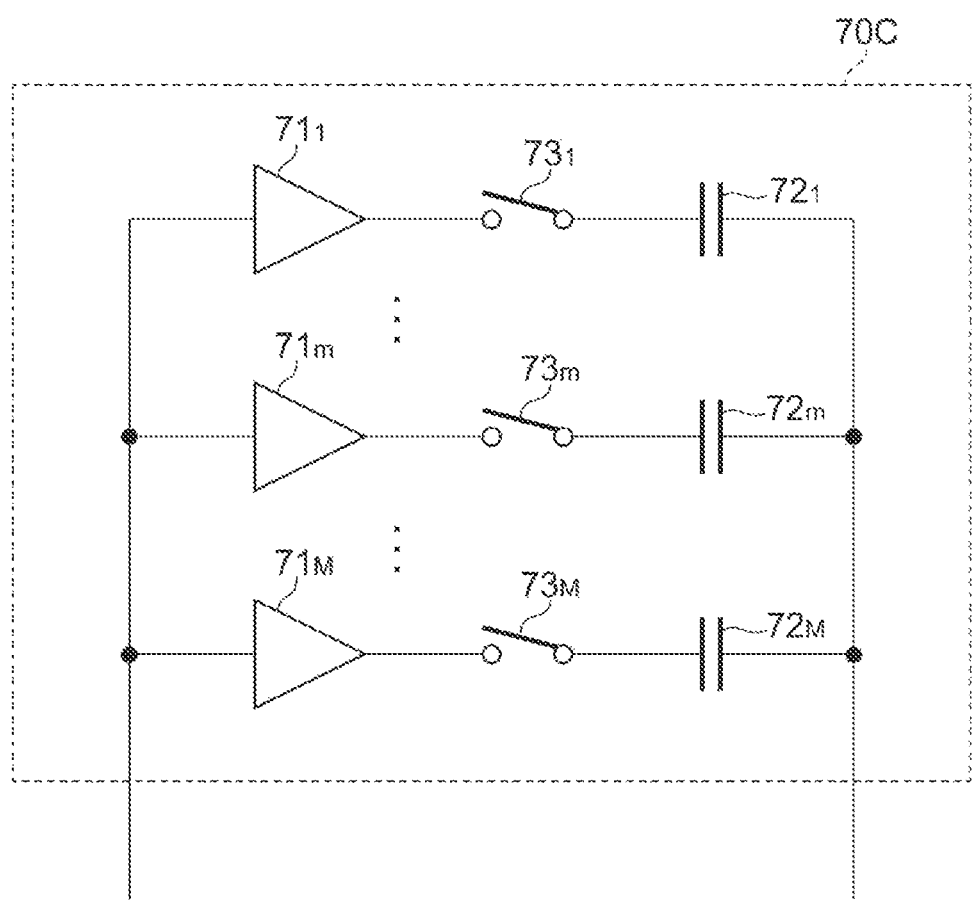
FIG. 14 is a diagram illustrating a configuration of a fourth configuration example of the phase compensation unit 70.

FIG. 14 is a diagram illustrating a configuration according to a fourth configuration example of the phase compensation unit 70. A phase compensation unit 70C according to the fourth configuration example illustrated in this figure includes the buffers $71_1$ to $71_M$, the capacitance elements $72_1$ to $72_M$, and the switches $73_1$ to $73_M$. The set including the buffer $71_m$, the capacitance element $72_m$, and the switch $73_m$ is referred to as an m-th set, and the first to M-th sets are connected in parallel to each other. In the phase compensation unit 70C according to the fourth configuration example, the switch $73_m$ is provided between the buffer $71_m$ and the capacitance element $72_m$.

In the third configuration example (FIG. 13) and the fourth configuration example (FIG. 14), the switch $73_m$ may be provided in all of the first to M-th sets, or the switch $73_m$ may be provided in any one set or a plurality of sets among the first to M-th sets. In the third configuration example and the fourth configuration example, it is possible to adjust the degree of phase compensation according to on/off setting of each of the switches $73_1$ to $73_M$.

Figure 15:
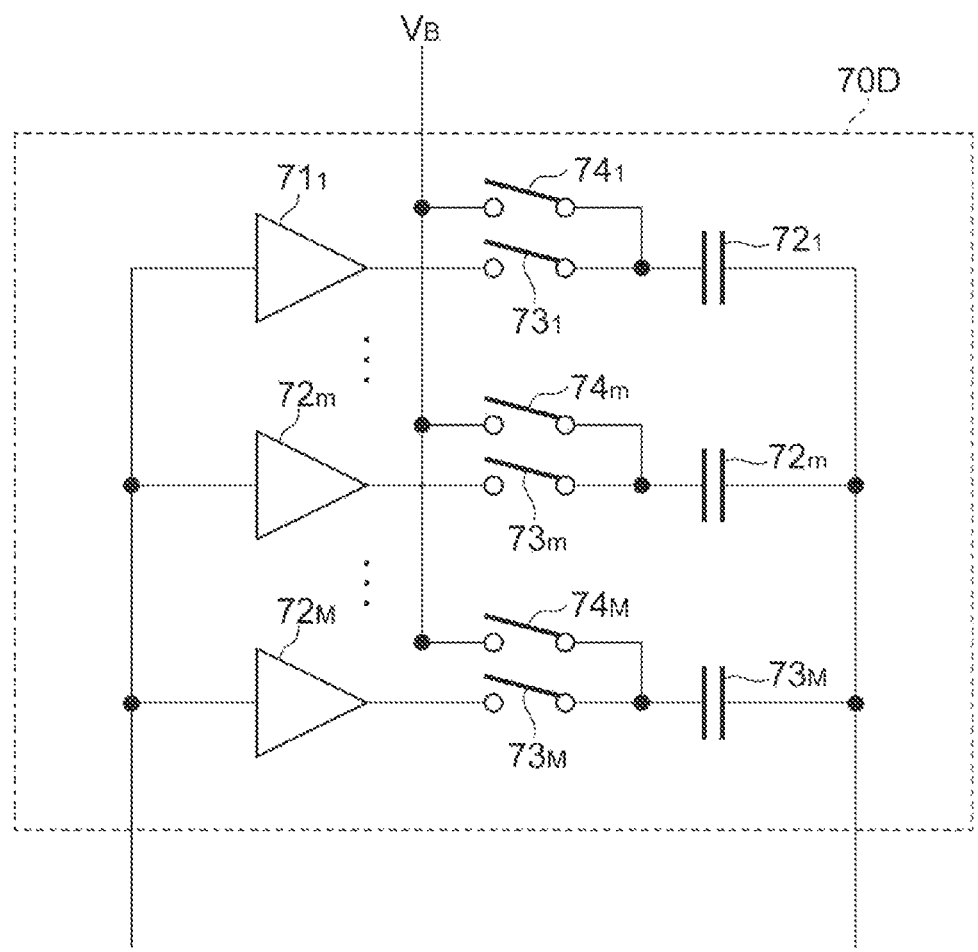
FIG. 15 is a diagram illustrating a configuration of a fifth configuration example of the phase compensation unit 70.

FIG. 15 is a diagram illustrating a configuration according to a fifth configuration example of the phase compensation unit 70. A phase compensation unit 70D according to the fifth configuration example illustrated in this figure includes the buffers $71_1$ to $71_M$, the capacitance elements $72_1$ to $72_M$, the switches $73_1$ to $73_M$, and switches $74_1$ to $74_M$. A set including the buffer $71_m$, the capacitance element $72_m$, the switch $73_m$, and the switch $74_m$ is referred to as an m-th set, and the first to M-th sets are connected in parallel to each other. In the phase compensation unit 70D according to the fifth configuration example, the switch $73_m$ is provided between the buffer $71_m$ and the capacitance element $72_m$. In addition, the switch $74_m$ is provided between a connection point of the capacitance element $72_m$ and the switch $73_m$ and a bias potential terminal to which a bias potential $V_B$ is input. When one of the switch $73_m$ and the switch $74_m$ included in the same set is set to ON, the other is set to OFF.

In the fifth configuration example (FIG. 15), the switches $73_m$ and $74_m$ may be provided in all of the first to M-th sets or the switches $73_m$ and $74_m$ may be provided in any one or a plurality of sets among the first to M-th sets. Also in the fifth configuration example, the degree of phase compensation can be adjusted according to ON/OFF setting of each of the switches $73_1$ to $73_M$.

In addition, in the fifth configuration example, the switch $73_m$ can be turned off and the switch $74_m$ can be turned on in a certain m-th set, and thus, a potential at a connection point between the capacitance element $72_m$ and the switch $73_m$ is stabilized at a bias potential $V_B$. Therefore, in the fifth configuration example, it is possible to avoid instability of a phase compensation operation when the switch $73_m$ of the m-th set is changed from OFF to ON.

In the fifth configuration example (FIG. 15), the switches $74_1$ to $74_M$ are added to the fourth configuration example (FIG. 14), but the switches $74_1$ to $74_M$ may also be added to the third configuration example (FIG. 13).

Next, a configuration example of the buffers 71 ($71_1$ to $71_M$) included in the phase compensation unit 70 (70A to 70D) will be described with reference to FIGS. 16 to 23.

Figure 16:
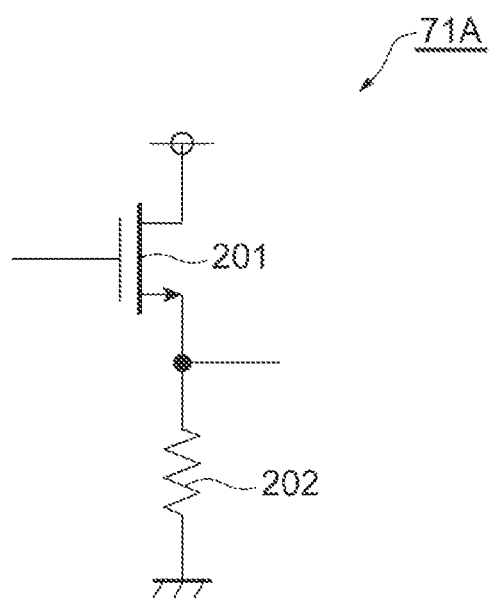
FIG. 16 is a diagram illustrating a first configuration example of a buffer 71.

FIG. 16 is a diagram illustrating a first configuration example of the buffers 71. A buffer 71A according to the first configuration example illustrated in this figure includes an NMOS transistor 201 and a load 202. A gate of the NMOS transistor 201 receives a phase difference signal output from the phase comparator 10. A drain of the NMOS transistor 201 is connected to a power supply potential terminal (first reference potential terminal). A source of the NMOS transistor 201 is connected to the third capacitance element 72. The load 202 is provided between the source of the NMOS transistor 201 and a ground potential terminal (second reference potential terminal).

Figure 17:
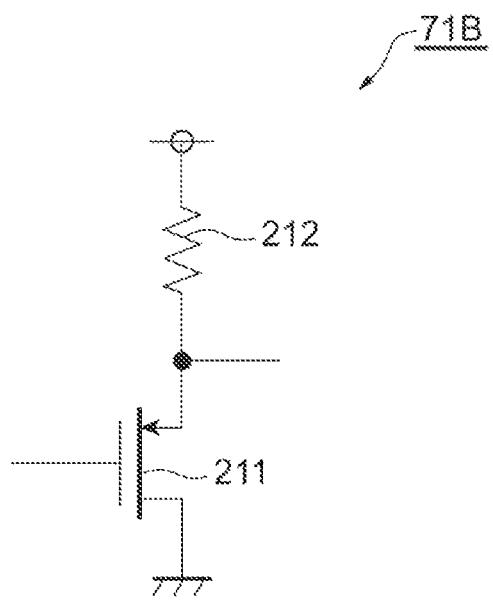
FIG. 17 is a diagram illustrating a second configuration example of the buffer 71.

FIG. 17 is a diagram illustrating a second configuration example of the buffers 71. A buffer 71B according to the second configuration example illustrated in this figure includes a PMOS transistor 211 and a load 212. A gate of the PMOS transistor 211 receives the phase difference signal output from the phase comparator 10. A drain of the PMOS transistor 211 is connected to the ground potential terminal (first reference potential terminal). A source of the PMOS transistor 211 is connected to the third capacitance element 72. The load 212 is provided between the source of the PMOS transistor 211 and the power supply potential terminal (second reference potential terminal).

In the first configuration example (FIG. 16) and the second configuration example (FIG. 17), a logic level of a signal output from the source of the MOS transistor to the third capacitance element 72 is the same as a logic level of a phase difference signal input to the gate of the MOS transistor. That is, gains of the buffers 71A and 71B have positive values. The buffer 71A or the buffer 71B may be cascaded in multiple stages.

Figure 18:
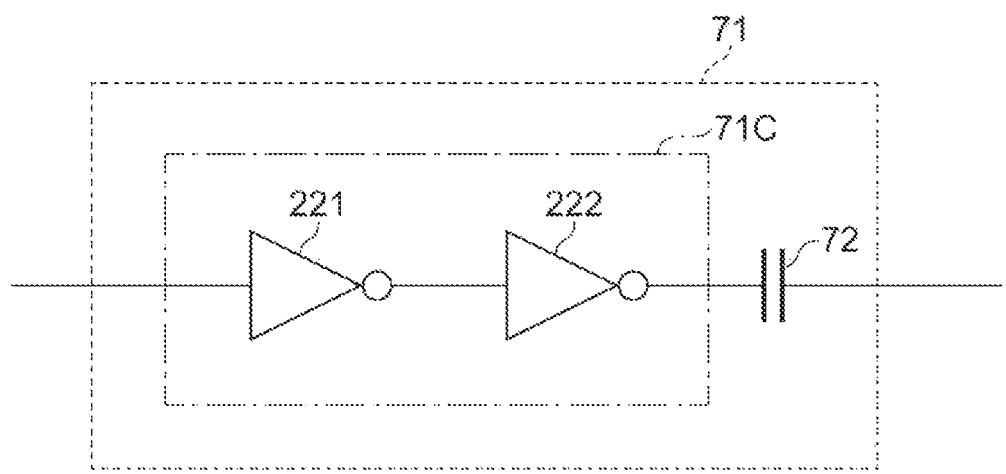
FIG. 18 is a diagram illustrating a third configuration example of the buffer 71.

FIG. 18 is a diagram illustrating a third configuration example of the buffer 71. The buffer 71C according to the third configuration example illustrated in this figure has a configuration in which two inverter circuits 221 and 222 are connected in cascade. The number of cascade-connected inverter circuits may be two and may be an even number. Thereby, a gain of the buffer 71C has a positive value. One or a plurality of inverter circuits of any of the even-numbered inverter circuits may have the configurations illustrated in FIG. 19 to FIG. 23. In addition, inverter circuits having the other configurations may be connected in cascade.

Figure 19:
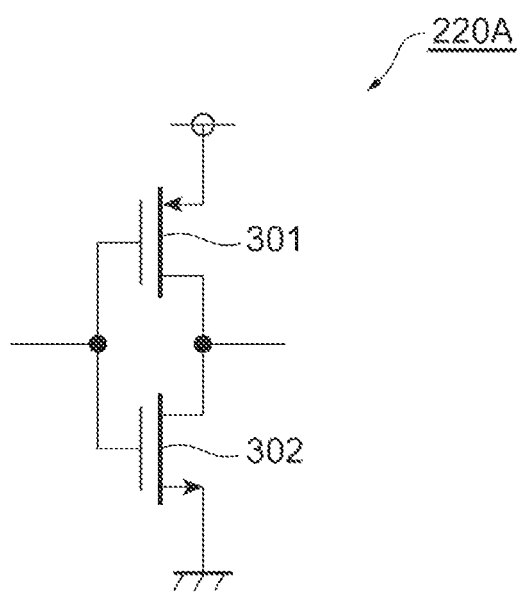
FIG. 19 is a diagram illustrating a first configuration example of an inverter circuit.

FIG. 19 is a diagram illustrating a first configuration example of the inverter circuit. An inverter circuit 220A according to the first configuration example illustrated in this figure includes a PMOS transistor 301 and an NMOS transistor 302. A source of the PMOS transistor 301 is connected to the power supply potential terminal. A source of the NMOS transistor 302 is connected to the ground potential terminal. The inverter circuit 220A has an output terminal formed by connecting drains of the PMOS transistor 301 and the NMOS transistor 302 to each other and outputs a logically inverted signal of a signal commonly input to gates of the PMOS transistor 301 and the NMOS transistor 302 from the output terminal.

Figure 20:
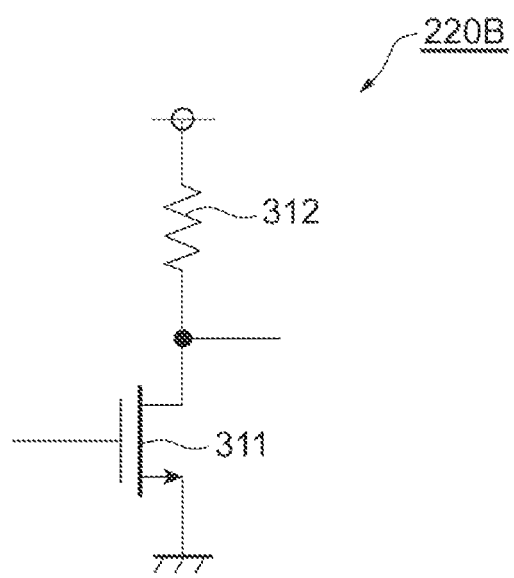
FIG. 20 is a diagram illustrating a second configuration example of the inverter circuit.

FIG. 20 is a diagram illustrating a second configuration example of the inverter circuit. An inverter circuit 220B according to the second configuration example illustrated in this figure includes an NMOS transistor 311 and a load 312. The load 312 is provided between a drain of the NMOS transistor 311 and the power supply potential terminal (first reference potential terminal). A source of the NMOS transistor 311 is connected to the ground potential terminal (second reference potential terminal). The inverter circuit 220B outputs a logically inverted signal of a signal input to a gate of the NMOS transistor 311 from the drain of the NMOS transistor 311.

Figure 21:
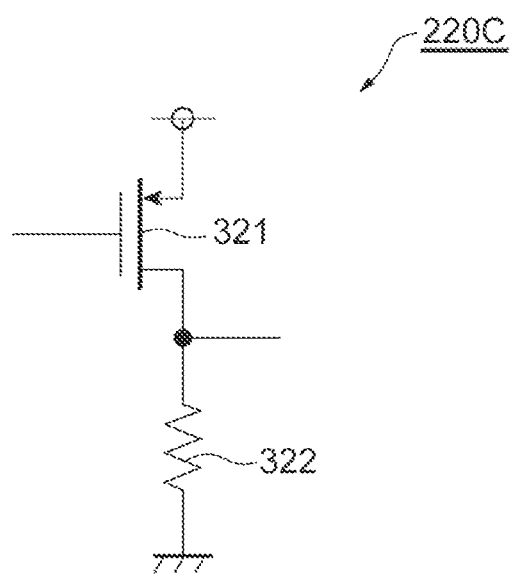
FIG. 21 is a diagram illustrating a third configuration example of the inverter circuit.

FIG. 21 is a diagram illustrating a third configuration example of the inverter circuit. An inverter circuit 220C according to the third configuration example illustrated in this figure includes a PMOS transistor 321 and a load 322. The load 322 is provided between a drain of the PMOS transistor 321 and the ground potential terminal (first reference potential terminal). A source of the PMOS transistor 321 is connected to the power supply potential terminal (second reference potential terminal). The inverter circuit 220C outputs a logically inverted signal of a signal input to a gate of the PMOS transistor 321 from the drain of the PMOS transistor 321.

Figure 22:
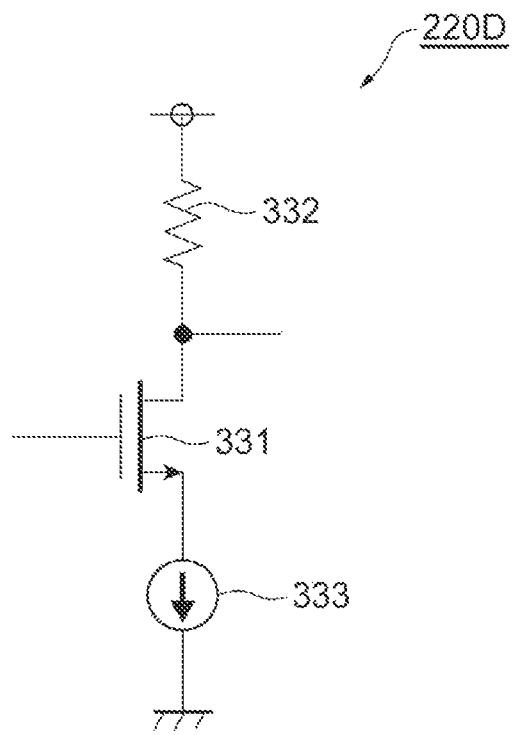
FIG. 22 is a diagram illustrating a fourth configuration example of the inverter circuit.

FIG. 22 is a diagram illustrating a fourth configuration example of the inverter circuit. An inverter circuit 220D according to the fourth configuration example illustrated in this figure includes an NMOS transistor 331, a load 332, and a current source 333. The load 332 is provided between a drain of the NMOS transistor 331 and the power supply potential terminal (first reference potential terminal). The current source 333 is provided between a source of the NMOS transistor 331 and the ground potential terminal (second reference potential terminal). The inverter circuit 220D outputs a logically inverted signal of a signal input to a gate of the NMOS transistor 331 from the drain of the NMOS transistor 331.

Figure 23:
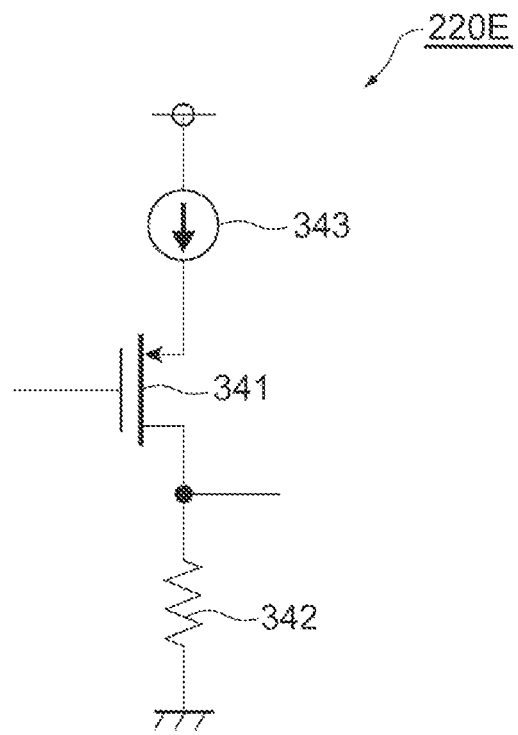
FIG. 23 is a diagram illustrating a fifth configuration example of the inverter circuit.

FIG. 23 is a diagram illustrating a fifth configuration example of the inverter circuit. An inverter circuit 220E according to the fifth configuration example illustrated in this figure includes a PMOS transistor 341, a load 342, and a current source 343. The load 342 is provided between a drain of the PMOS transistor 341 and the ground potential terminal (first reference potential terminal). The current source 343 is provided between a source of the PMOS transistor 341 and the power supply potential terminal (second reference potential terminal). The inverter circuit 220E outputs a logically inverted signal of a signal input to a gate of the PMOS transistor 341 from the drain of the PMOS transistor 341.

Next, a CDR apparatus including a PLL circuit will be described. The CDR apparatus receives a digital signal (for example, coding data of 8B10B or 128B130B) in which a clock is embedded, recovers data and a clock based on the digital signal, and outputs the recovered data and the recovered clock. The CDR apparatus is configured to include a PLL circuit and a sampler. In the CDR apparatus, the sampler samples the data of the digital signal at a timing instructed by the recovered clock and outputs the sampled data in synchronization with the recovered clock as recovered data. The PLL circuit receives the recovered data as an input signal to a phase comparator, outputs the recovered clock as an oscillation signal from a voltage controlled oscillator, and supplies the recovered clock to the sampler. By including the PLL circuit 1C including the phase compensation unit 70 illustrated in FIG. 8, the CDR apparatus can suppress operation instability caused by a parasitic capacitance. It is preferable that the phase comparator 10 is a Bang-Bang type.

Figure 24:
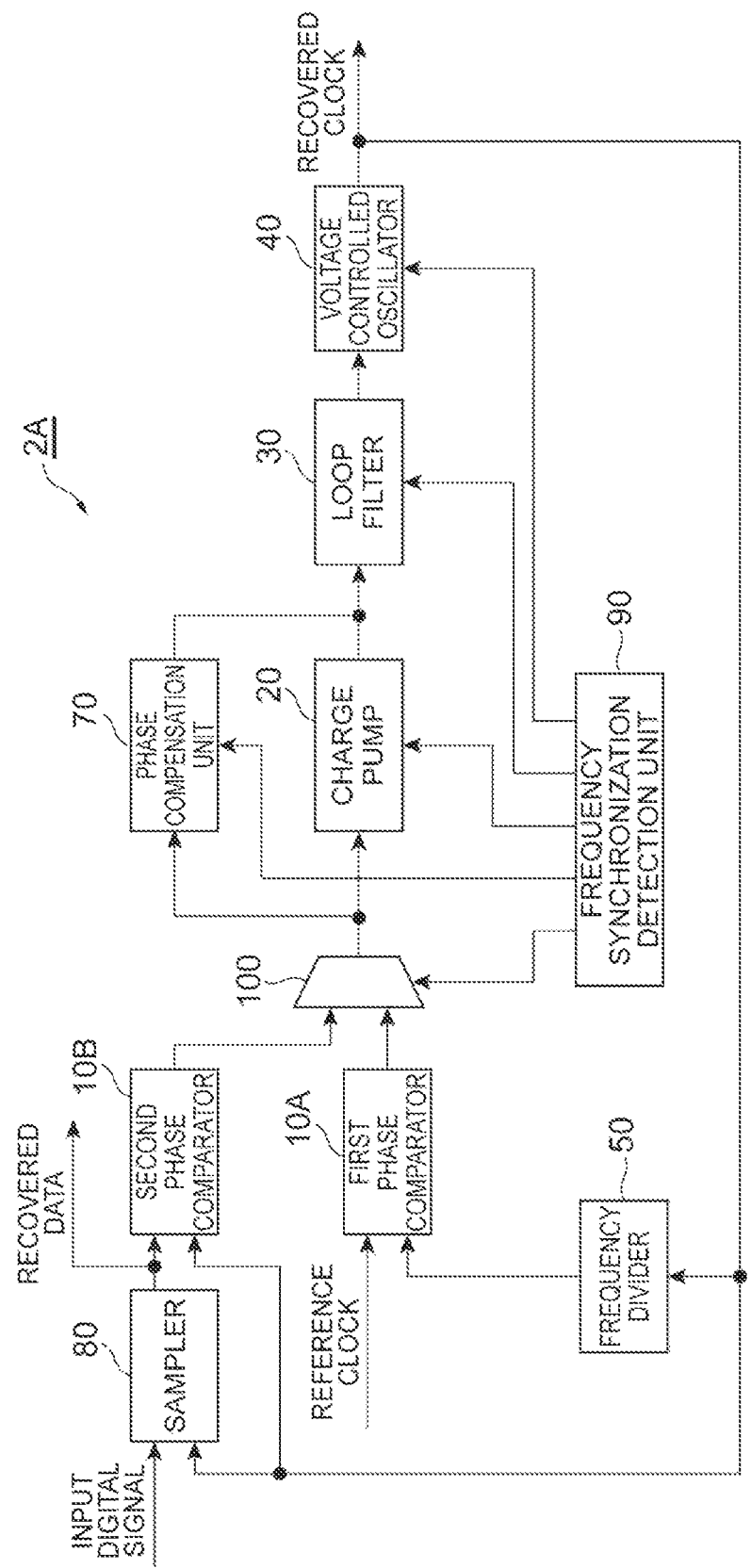
FIG. 24 is a diagram illustrating a configuration of a CDR apparatus 2A according to the present embodiment.

It is preferable that the CDR apparatus has a configuration illustrated in FIG. 24. FIG. 24 is a diagram illustrating a configuration of a CDR apparatus 2A according to the present embodiment. The CDR apparatus 2A includes a first phase comparator 10A, a second phase comparator 10B, the charge pump 20, the loop filter 30, the voltage controlled oscillator 40, the frequency divider 50, the phase compensation unit 70, a sampler 80, a frequency synchronization detection unit 90, and a selection unit 100.

Among the units, a loop including the first phase comparator 10A, the charge pump 20, the loop filter 30, the voltage controlled oscillator 40, the frequency divider 50, and the phase compensation unit 70 configures a first PLL circuit. A loop including the second phase comparator 10B, the charge pump 20, the loop filter 30, the voltage controlled oscillator 40, and the phase compensation unit 70 configure a second PLL circuit. In the first and second PLL circuits, the charge pump 20, the loop filter 30, the voltage controlled oscillator 40, and the phase compensation unit 70 are provided in common. The first and second PLL circuits have the same configuration as the PLL circuit 1C including the phase compensation unit 70 illustrated in FIG. 8. However, the second PLL circuit does not include the frequency divider 50.

The sampler 80 receives the digital signal having the clock embedded therein, samples data of the digital signal at a timing instructed by the recovered clock output as the oscillation signal from the voltage controlled oscillator 40, and outputs the sampled data to the second phase comparator 10B as the recovered data in synchronization with the recovered clock.

The second phase comparator 10B inputs recovered data as an input signal and receives the recovered clock output as the oscillation signal from the voltage controlled oscillator 40. Then, the second phase comparator 10B detects a phase difference between the recovered clock and the recovered data and outputs a phase difference signal representing the phase difference to a selection unit 100. It is preferable that the second phase comparator 10B is the Bang-Bang type.

The first phase comparator 10A receives a reference clock as an input signal and receives a feedback oscillation signal output from the frequency divider 50. Then, the first phase comparator 10A detects a phase difference between the feedback oscillation signal and the reference clock and outputs a phase difference signal representing the phase difference to the selection unit 100.

The frequency synchronization detection unit 90 detects whether or not frequencies are synchronized between the feedback oscillation signal input to the first phase comparator 10A and the reference clock. During a first period in which a frequency synchronization is not detected by the frequency synchronization detection unit 90, the selection unit 100 selects the phase difference signal output from the first phase comparator 10A receiving the reference oscillation signal as the input signal and outputs the selected phase difference signal to a charge pump 20. During a second period in which the frequency synchronization is detected by the frequency synchronization detection unit 90, the selection unit 100 selects the phase difference signal output from the second phase comparator 10B receiving the recovered data as an input signal and outputs the selected phase difference signal to the charge pump. The charge pump 20 receives the phase difference signal selected by the selection unit 100 and output therefrom.

In the CDR apparatus 2A, during the first period in which the frequency synchronization is not established, the first PLL circuit including the first phase comparator 10A receiving the reference clock operates. Meanwhile, during the second period in which the frequency synchronization is established, the second PLL circuit including the second phase comparator 10B receiving the recovered data output from the sampler 80 operates. Therefore, it is possible to stabilize an operation of the first PLL circuit using the reference clock in a short time, and to start recovery of data and clock at an early stage based on the input digital signal.

In addition, it is preferable that, in the CDR apparatus 2A, any of the charge pump 20, the loop filter 30, the voltage controlled oscillator 40, and the phase compensation unit 70 has different parameter values during the first period and the second period. For example, during the first period and the second period, frequency division ratios N are different from each other, and required bandwidths are also different from each other. Accordingly, by adjusting any of the conductance $g_m$ of the charge pump 20, a resistance value R of the resistor 31, the capacitance value $C_1$ of the first capacitance element 32, the capacitance value $C_2$ of the second capacitance element 33, the characteristic $K_{VCO}$ of the voltage controlled oscillator 40, the gain A of the buffer 71, and the capacitance values $C_S$ of the third capacitance element 72, a preferable open-loop transfer function $H_{open}(s)$ can be realized during both the first period and the second period.

FIG. 25 is a table illustrating one example of each parameter value of the CDR apparatus 2A according to the present embodiment during each of the first period and the second period. In this example, the frequency division ratio N is 200 during the first period, while the frequency division ratio N is 1 during the second period. The required bandwidth is 1 MHz during the first period, while the required bandwidth is 10 MHz during the second period. According to this, $g_m$ is 50 μA during the first period, and $g_m$ is 10 μA during the second period. R is 20 kΩ during the first period, and R is 1 kΩ during the second period. In addition, $C_S$ is 1 pF during the first period, and $C_S$ is 0.5 pF during the second period. During both the first period and the second period, $C_1$ is 10 pF, $K_{VCO}$ is 2 GHz/V, and $C_2$ is 5 pF. In this way, by adjusting each parameter value, a preferable open-loop transfer function $H_{open}(s)$ can be realized during both the first period and the second period.

Figure 26:
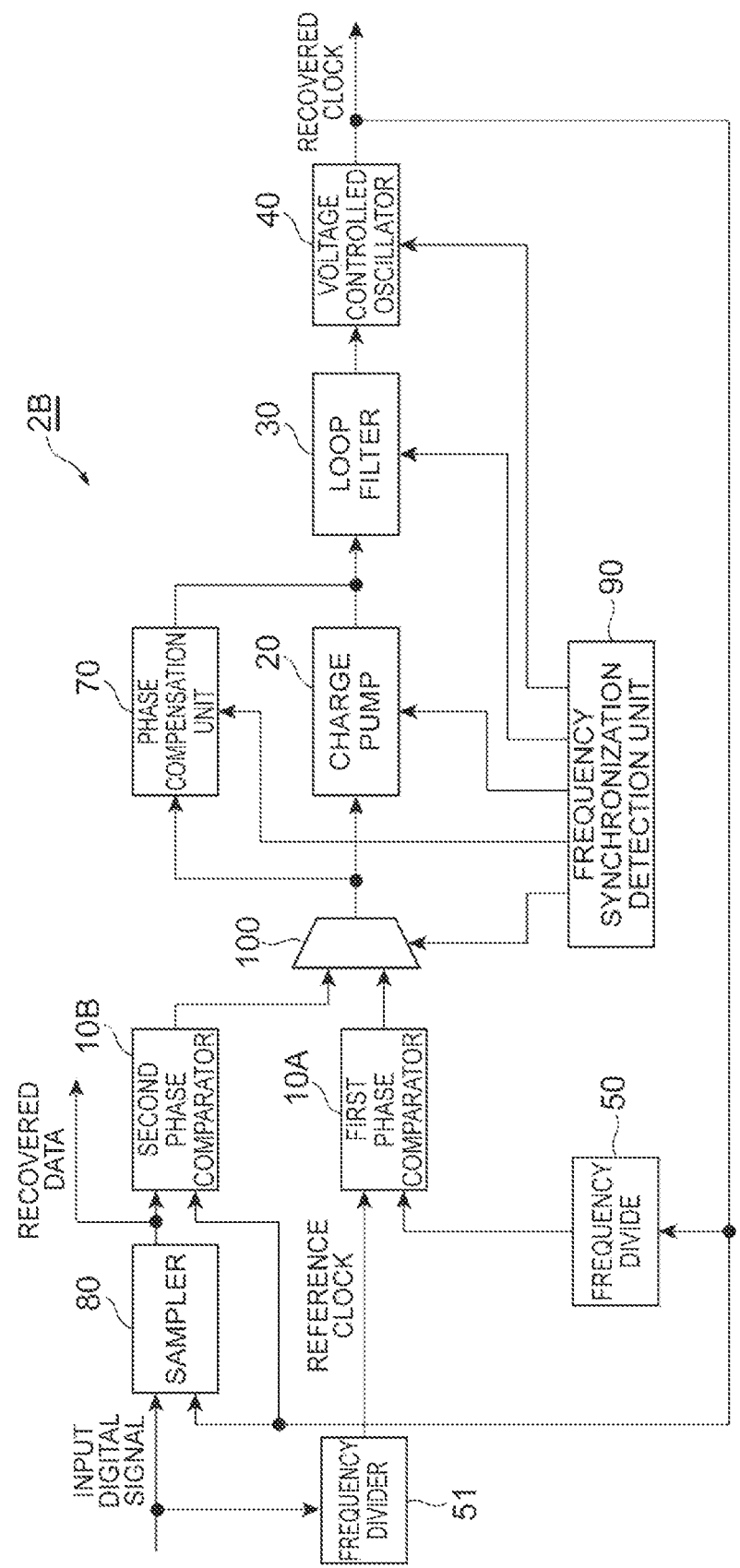
FIG. 26 is a diagram illustrating a configuration of a CDR apparatus 2B according to another embodiment.
Figure 27:
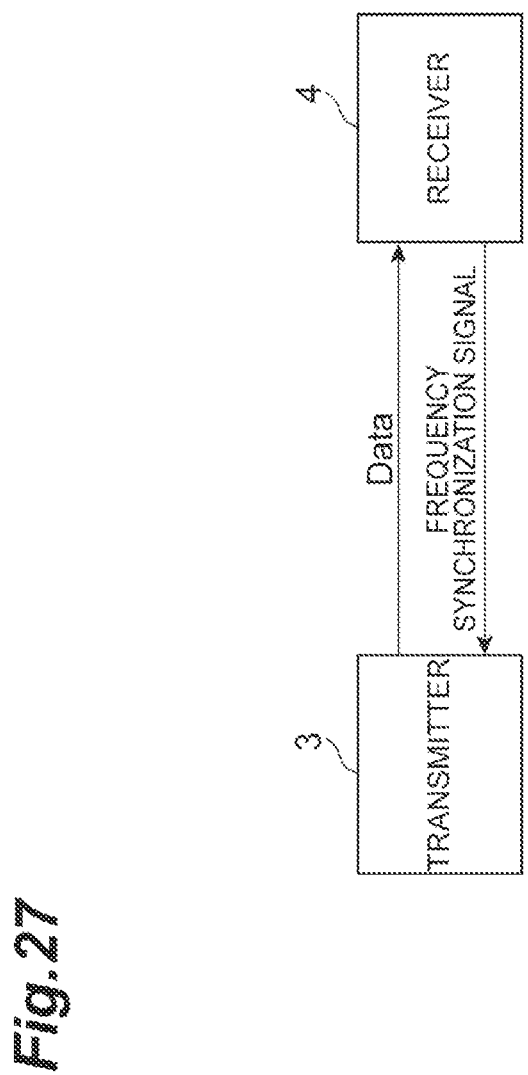
FIG. 27 is a diagram illustrating a configuration of a transmission and reception system including a transmitter 3 and a receiver 4.
Figure 28:
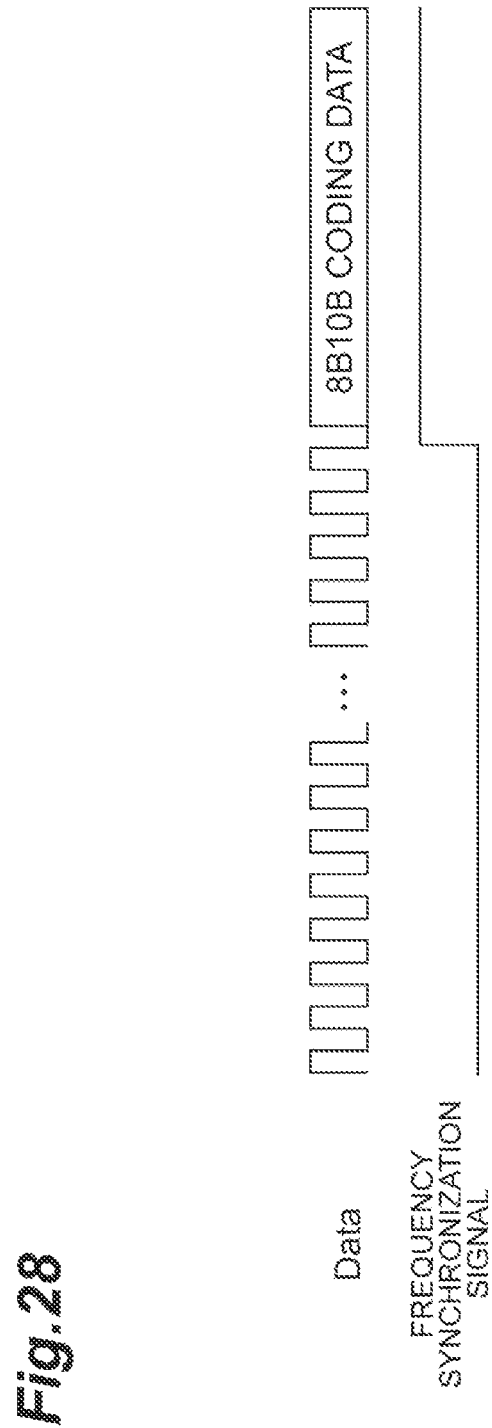
FIG. 28 is a diagram illustrating transmission and reception of data and a frequency synchronization signal between the transmitter 3 and the receiver 4.

FIG. 26 is a diagram illustrating a configuration of the CDR apparatus 2B according to another embodiment. Compared with the configuration of the CDR apparatus 2A illustrated in FIG. 24, the CDR apparatus 2B illustrated in FIG. 26 is different from the CDR apparatus 2A in that a frequency divider 51 is further included. FIG. 27 is a diagram illustrating a configuration of a transmission and reception system including a transmitter 3 and a receiver 4. The CDR apparatus 2B is included in the receiver 4. FIG. 28 is a diagram illustrating transmission and reception of data and a frequency synchronization signal between the transmitter 3 and the receiver 4. Data of a digital signal is transmitted from the transmitter 3 to the receiver 4. A frequency synchronization signal representing a detection result of the frequency synchronization detection unit 90 is transmitted from the receiver 4 to the transmitter 3.

In a case where the digital signal transmitted from the transmitter 3 to the receiver 4 is data of a pattern repeated for a constant period like 101010 . . . , the frequency divider 51 divides a frequency of the digital signal to obtain a reference clock and outputs the reference clock to the first phase comparator 10A. The first phase comparator 10A receives the reference clock and receives a feedback oscillation signal output from the frequency divider 50. Then, the first phase comparator 10A detects a phase difference between the feedback oscillation signal and the reference clock and outputs a phase difference signal representing the phase difference to the selection unit 100.

The frequency synchronization detection unit 90 detects whether or not frequencies are synchronized between the feedback oscillation signal and the reference clock which are input to the first phase comparator 10A. The digital signal transmitted from the transmitter 3 to the receiver 4 is data of a pattern repeated for a constant period, and during the first period in which a frequency synchronization is not detected by the frequency synchronization detection unit 90, the frequency synchronization signal transmitted from the receiver 4 to the transmitter 3 is at a low level. During the second period in which the frequency synchronization is detected by the frequency synchronization detection unit 90, the frequency synchronization signal sent from the receiver 4 to the transmitter 3 is changed to a high level. Upon receipt of the frequency synchronization signal of the high level, the transmitter 3 starts to transmit the data coded as, for example, 8B10B to the receiver 4.

During the first period in which the frequency synchronization is not detected by the frequency synchronization detection unit 90, the selection unit 100 selects the phase difference signal output from the first phase comparator 10A receiving the reference oscillation signal as an input signal and outputs the selected signal to a charge pump. During the second period in which the frequency synchronization is detected by the frequency synchronization detection unit 90, the selection unit 100 selects the phase difference signal output from the second phase comparator 10B receiving the recovered data as an input signal, and outputs the selected signal to the charge pump. The charge pump 20 receives the phase difference signal selected by the selection unit 100 and output therefrom.

The CDR apparatus 2B can stabilize the operation of the first PLL circuit using the reference clock in a short time based on the data of the pattern which is sent from the transmitter 3 and repeated for a constant period, and start recovery of data and clock at an early stage based on the input digital signal.

As stated above, the above PLL circuit comprises: a voltage controlled oscillator; a phase comparator including an input terminal connected to an output terminal of the voltage controlled oscillator; a charge pump including an input terminal connected to an output terminal of the phase comparator; a loop filter including: an input terminal connected to an output terminal of the charge pump, and an output terminal connected to an input terminal of the voltage controlled oscillator; and a phase compensator provided in parallel with the charge pump.

What is claimed is:

1. A PLL circuit comprising:
    a voltage controlled oscillator receiving a control voltage value and outputting an oscillation signal having a frequency corresponding to the control voltage value;
    a phase comparator receiving the oscillation signal output from the voltage controlled oscillator or a signal obtained by dividing a frequency of the oscillation signal as a feedback oscillation signal and also receiving an input signal, detecting a phase difference between the feedback oscillation signal and the input signal, and outputting a phase difference signal representing the phase difference;
    a charge pump receiving the phase difference signal output from the phase comparator and outputting a charging and discharging current according to the phase difference represented by the phase difference signal;
    a loop filter receiving the charging and discharging current output from the charge pump and outputting the control voltage value increased or decreased according to an amount of charging and discharging to the voltage controlled oscillator; and
    a phase compensator provided in parallel with the charge pump and adding a differentiation term to an open-loop transfer function.

2. The PLL circuit according to claim 1,
    wherein the loop filter includes a resistor receiving the charging and discharging current output from the charge pump at a first terminal, a first capacitance element connected to a second terminal of the resistor; and a second capacitance element connected to the first terminal of the resistor, and
    wherein the phase compensator includes a buffer receiving the phase difference signal output from the phase comparator and a third capacitance element provided between an output terminal of the buffer and the first terminal of the resistor.

3. The PLL circuit according to claim 2,
    wherein a relationship of $AC_S/g_m=(C_2+AC_S)R$ is established between a conductance $g_m$ of the charge pump, a resistance value R of the resistor, a capacitance value $C_2$ of the second capacitance element, a capacitance value $C_S$ of the third capacitance element, and a gain A of the buffer.

4. The PLL circuit according to claim 2,
    wherein the second capacitance element and the third capacitance element have the same configuration.

5. The PLL circuit according to claim 2,
    wherein the phase compensator includes M sets, each including the buffer and the third capacitance element, connected in parallel with each other.

6. The PLL circuit according to claim 5,
    wherein the phase compensator includes a switch provided between the buffer and the third capacitance element or between the third capacitance element and the loop filter in any one of the M sets or a plurality of sets.

7. The PLL circuit according to claim 5,
    wherein the phase compensator includes a first switch provided between the buffer and the third capacitance element or between the third capacitance element and the loop filter and a second switch provided between a connection point of the third capacitance element and the first switch and a bias potential terminal, in any one of the M sets or a plurality of sets.

8. The PLL circuit according to claim 2,
    wherein the buffer includes a MOS transistor and a load, a gate of the MOS transistor receives the phase difference signal, a drain of the MOS transistor is connected to a first reference potential terminal, a source of the MOS transistor is connected to the third capacitance element, and the load is provided between the source of the MOS transistor and a second reference potential terminal.

9. The PLL circuit according to claim 2,
wherein the buffer includes even-numbered inverter circuits connected in cascade.

10. The PLL circuit according to claim 9,
wherein any one or a plurality of inverter circuits of the even-numbered inverter circuits include a PMOS transistor and an NMOS transistor, include an output terminal configured by connecting each drain of the PMOS transistor and the NMOS transistor with each other, and outputs a logically inverted signal of a signal commonly input to gates of the PMOS transistor and the NMOS transistor from the output terminal.

11. The PLL circuit according to claim 9,
wherein any one or a plurality of inverter circuits of the even-numbered inverter circuits include a MOS transistor and a load, the load is provided between a drain of the MOS transistor and a first reference potential terminal, a source of the MOS transistor is connected to a second reference potential terminal, and a logically inverted signal of a signal input to a gate of the MOS transistor is output from the drain of the MOS transistor.

12. The PLL circuit according to claim 9,
wherein any one or a plurality of inverter circuits of the even-numbered inverter circuits include a MOS transistor, a load, and a current source, the load is provided between a drain of the MOS transistor and a first reference potential terminal, the current source is provided between a source of the MOS transistor and a second reference potential terminal, and a logically inverted signal of a signal input to a gate of the MOS transistor is output from the drain of the MOS transistor.

13. A CDR apparatus receiving a digital signal in which a clock is embedded, recovering data and the clock based on the digital signal, and outputting the recovered data and the recovered clock, comprising:
a sampler sampling the data of the digital signal at a timing instructed by the recovered clock and outputting the sampled data as the recovered data in synchronization with the recovered clock; and
the PLL circuit according to claim 1, which receives the recovered data to the phase comparator as the input signal, outputs the recovered clock as the oscillation signal from the voltage controlled oscillator, and provides the sampler with the recovered clock.

14. A CDR apparatus receiving a digital signal in which a clock is embedded, recovering data and the clock based on the digital signal, and outputting the recovered data and the recovered clock, comprising:
a sampler sampling the data of the digital signal at a timing instructed by the recovered clock and outputting the sampled data as the recovered data in synchronization with the recovered clock;
the PLL circuit according to claim 1, which includes a first phase comparator and a second phase comparator as the phase comparator, outputs the recovered clock as the oscillation signal from the voltage controlled oscillator, and provides the sampler with the recovered clock;
a frequency synchronization detection unit detecting whether or not frequencies are synchronized between the feedback oscillation signal and a reference clock input to the first phase comparator; and
a selection unit selecting a phase difference signal output from the first phase comparator receiving a reference oscillation signal as the input signal and outputting the selected phase difference signal to the charge pump during a first period in which a frequency synchronization is not detected by the frequency synchronization detection unit, and selecting the phase difference signal output from the second phase comparator receiving the recovered data as the input signal and outputting the selected phase difference signal to the charge pump during a second period in which the frequency synchronization is detected by the frequency synchronization detection unit.

15. The CDR apparatus according to claim 14,
wherein any of the charge pump, the loop filter, the voltage controlled oscillator, and the phase compensator has parameter values different from each other during the first period and the second period.

* * * * *